United States Patent [19]

Wolf

[11] 4,291,375

[45] Sep. 22, 1981

[54] PORTABLE PROGRAMMER-READER UNIT FOR PROGRAMMABLE TIME REGISTERING ELECTRIC ENERGY METERS

[75] Inventor: Thomas G. Wolf, Monroeville, Pa.

[73] Assignee: Westinghouse Electric Corp., Pittsburgh, Pa.

[21] Appl. No.: 25,514

[22] Filed: Mar. 30, 1979

[51] Int. Cl.³ .................. G01R 21/00; G06F 15/56; G06F 15/20

[52] U.S. Cl. .................. 364/483; 364/464; 364/900; 324/103 R

[58] Field of Search ... 364/200 MS File, 900 MS File, 364/483, 492, 464; 324/76 R, 78 D, 103 R, 115, 110, 112, 113, 99 D, 142; 235/432; 340/310 R, 151; 346/14 MR; 361/79, 86, 87

[56] References Cited

U.S. PATENT DOCUMENTS

| | | | |
|---|---|---|---|
| 3,932,730 | 1/1976 | Ambrosio | 346/14 MR X |
| 4,012,734 | 3/1977 | Vagoda et al. | 340/310 A |
| 4,050,020 | 9/1977 | Germer | 324/116 |
| 4,077,061 | 2/1978 | Johnston et al. | 364/483 |
| 4,093,997 | 6/1978 | Germer | 364/900 |
| 4,106,095 | 8/1978 | Yarbrough | 364/464 |
| 4,119,948 | 10/1978 | Ward et al. | 340/151 |
| 4,120,031 | 10/1978 | Kincheloe et al. | 364/464 |
| 4,133,034 | 1/1979 | Etter | 364/483 |

Primary Examiner—James D. Thomas
Attorney, Agent, or Firm—E. L. Pencoske

[57] ABSTRACT

A portable programmer-reader unit for programmable time registering AC electric energy meters utilizing replaceable program control data includes plural memory locations for programming, time and date synchronization, readout, and monitoring of the coded values of identical data items included in the meter program control data. A visual display provides numerical readouts of the data items including meter readings for different time categories of electric energy measurement by said meter and indication of error condtions. Manual control and a data entry inputs control meter data communication, readouts of the visual display and modification of the data items stored in the programmer-reader unit for programming the meter. Power conserving logic circuits extend field use while operating with a battery power supply.

22 Claims, 19 Drawing Figures

PORTABLE PROGRAMMER-READER UNIT FOR PROGRAMMABLE TIME REGISTERING ELECTRIC ENERGY METERS

CROSS-REFERENCE TO RELATED APPLICATIONS

This invention is related to U.S. patent application Ser. No. 891,997 for "A Programmable AC Electric Energy Meter Having Radiation Responsive External Data Interface", and U.S. Pat. No. 4,197,582 for "An Auxiliary Power Supply And Timer Arrangement For Time Registering Multifunctional Electric Energy Meters", both filed Mar. 31, 1978 and assigned to the assignee of this invention.

BACKGROUND OF THE INVENTION

In time registering and programmable AC electric energy meters, also referred to as time of day meters, a programmable time based measuring system has a program sequence of operation. Measurement of one or more parameters of electric energy flow are measured in one of at least three time of consumption or usage categories. The sequence of operation is controlled by a meter program memory which accommodates certain replaceable and alterable meter control data so that the meter may be programmed for various measurement or billing rate schedules on a time and date basis. The meter control data also defines calculations and/or conversion factors and functions as well as time and date data which are required for calculations of selected energy parameters to be measured on a time basis. Typically, kilowatt demand and kilowatthour electric energy parameters are measured for the peak, intermediate or midpeak and base or low electric load demand times of an electric utility supplying distribution or system network. The meter measuring rate schedule has a timed schedule corresponding to the variations of power demand or loading of the electric energy supplier. The time of usage measurements are separately accumulated for billing at different rates.

It is desirable to electronically program the meters with the control data for various measuring schedules to produce measurements for the different billing rate times. Also, the programmed meter control data must be capable of being checked and authenticated. The electronically generated measuring data representing different parameters accumulated in different time categories are to be electronically read and stored in the field at meter installed locations. Since the measurements are made on a real time and date basis, checking and resynchronization of the time and date information is also required so that the energy flow measurements are in synchronism with the actual date and real time. Since meter initializing, programming and reprogramming, data checking, and meter data readouts may be done with large numbers of programmable meters at one time, or selectively in the field, data to be programmed and readout must be easily and conveniently accessed, recorded and checked with a minimum of time and operator steps.

Accordingly, it is desirable to have a portable self-contained programmer-reader (PR) unit which stores therein the replaceable and alterable meter control data of a programmable time registering electric energy meter in such a manner that the meter control data can be easily replaced or manually modified or corrected. Further, the PR unit must have its own time and date generating and accumulating operation for checking and resynchronizing the time and data registrations of the programmable meter. The PR unit also must be capable of recording the measurement data of the meter and visually displaying such data as well as performing certain checks and data verification steps and displaying and identifying any errors. Since the PR unit is used in the field, its operation must be maintained by batteries and a battery power conservation feature is to be incorporated for continuously powering only critical memory and timer circuits. The PR sequence controller is preferably periodically energized for time and date updating. Higher power consuming circuits are to be selectively energized whereby display, data entry, and data communication and transfer operations are powered during short time controlled periods so as to further conserve the battery power. Bulk data storage for field meter readouts of many meters is desirably transmittable to a central billing center requiring the meter data to be converted to a standard communications code such as may be receivable by a teletype writer printer.

The aforementioned requirements are provided by a portable PR unit described briefly hereinafter for a measuring system a programmable time registering AC electric energy meter.

SUMMARY OF THE INVENTION

In accordance with the present invention a portable programmer-reader (PR) unit is included in a measuring system including a programmable time registering meter for measuring the flow of a quantity, such as electric energy, in different time-related categories. The PR unit is operable to initialize, selectively reprogram, read accumulated measuring data and perform data verification and checking including time and data synchronization of the programmable meter.

A solid state metering sequence controller is included in the meter and is of a microprocessor type operating with a fixed meter program memory. A programmable read only memory module (M-PROM) stores the fixed program memory which has a format providing for alternate modes of meter operation for use in universal metering applications. The programmable meter further includes a general purpose read-write or random access memory module (M-RAM) which includes a memory area externally accessible by the PR unit. Replaceable and alterable meter control data is stored in the externally accessible area of M-RAM for defining the different meter operating modes. The meter control data is supplied by the PR unit during initialization thereof for programming metering time schedules, parameters to be measured, time and date data and calculation and conversion constants.

The externally accessible meter data in M-RAM further includes real time and date data and accumulated time based measuring data produced by the metering sequence controller. The data items of the externally accessible meter data are capable of being read out by the PR unit in alternate modes of operation including supervisor, reprogram and read modes.

The PR unit includes a solid state electronic sequence controller, also of a microprocessor type, operating with a fixed program memory included in a programmable read only memory module (PR-PROM). Replaceable PROM chips are included in the PR-PROM for storing different sets of constant data items of the meter control data. A random access memory module (PR-RAM) in the PR unit includes three identical meter data memory areas each corresponding, in a data imaging format, to the externally accessible memory area of the M-RAM. One of the meter data areas of PR-RAM includes meter programming input data and the other two meter data areas of PR-RAM are defined as first or new and second or old meter output data. The meter input data in PR-RAM stores selected ones of the sets of fixed meter control data of the replaceable PR-PROM chips and/or manually entered meter program data.

Designated data items of the meter data memories in PR-RAM are capable of being wholly or partially transmitted to the externally accessible memory area of M-RAM. The first or new meter output data is received for storing and saving freshly reprogrammed meter data. The second or old meter output data is received for monitoring and reading existing or currently operating meter data. The meter data memory areas of PR-RAM are selectively utilized in the different supervisor, reprogram and read modes for total and partial meter programming and meter data reading and authenticating. The PR-RAM also separately stores and accumulates real time and date data so it can be stored in its meter input data memory for initializing the meter and for checking and synchronizing the real time and date data of an operating meter. In a preferred mode, the meter time and date data are refreshed from the PR unit during each meter communication cycle.

The PR unit includes external inputs and outputs which are formed by a display, data entry and manual control inputs, an external data communication interface, and a data transfer module. The display provides visual readout of the data items stored in the three PR-RAM meter data memories. The data items are formed by the constant and variable meter control data items, the variable meter measuring and operating data items and the variable PR synchronizing and authenticating data times. The data items are identified by display identification codes in a predetermined sequential order.

The PR unit control inputs provide for selection of one of the three PR unit modes, for advance and decrement in the visual readout sequence of displayed data items, and for initiating communication and data transfer between the PR unit and the meter. The data entry includes a keyboard for entering time and date data, unique meter identification codes and modification of the data items stored in the meter input data memory of PR-RAM. Also, the data entry input permits direct call-up of a stored data item for visual readout by entering its display identification code. In data authenticating operation of the PR unit, the display provides error identification codes indicating incorrect received meter data or errors occurring in data transmission between the meter and PR unit.

The data transfer module provides transmission of meter identification and measuring data of many separately identified meter data outputs stored in a bulk or mass data memory area of PR-RAM for subsequent readout to central data translating or data computer equipment or to a data transmission link connected to such equipment.

The PR unit is supplied by a battery powered power supply and only the critical memory and timer circuits are continuously energized for extended field use. The time and date accumulation is accomplished by regular timing signals sent from the timer circuit to an interrupt input of the PR sequence controller which increments the time and date data in the PR-RAM. Further, power to the display is time controlled so that the data items are displayed for short time intervals during which the display output is energized and then de-energized until a request for the visual readout of another data item is made from the data entry. The other high PR unit power consuming circuits are de-energized along with the display output. A power-on logic circuit is responsive to both the data entry and the timing signals to initiate turn-on of the PR sequence controller. A time delay operation feature is provided to briefly isolate and buffer the sequence controller outputs from the PR-RAM memory immediately following power on and power down cycles of operations. This assures that circuit logic states have a correct static value before entry into the RAM memory to protect it from initial power turn-on and turn-off transients.

DESCRIPTION OF THE PREFERRED EMBODIMENT

Figure 1:
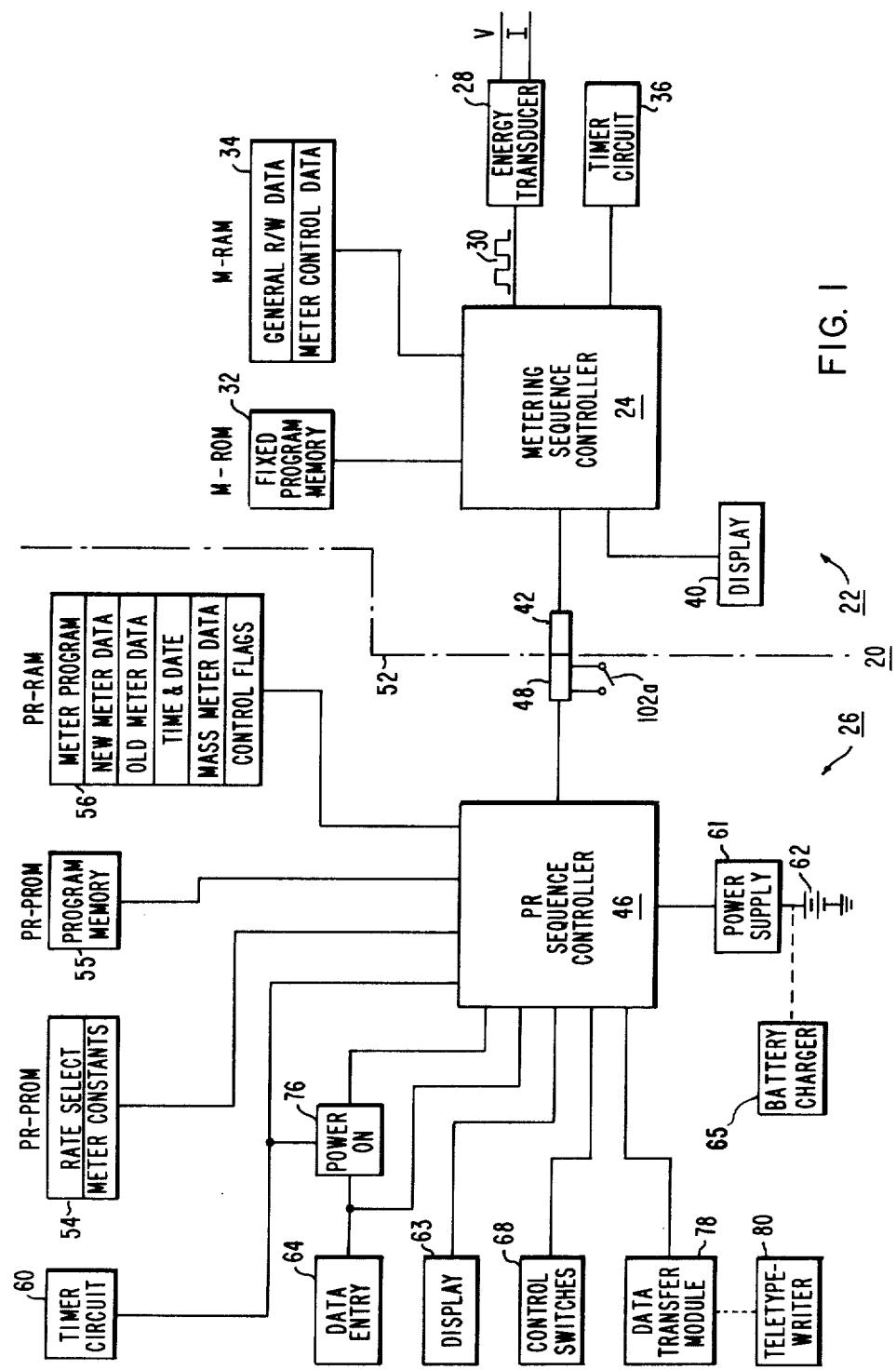
FIG. 1 is a block schematic diagram of an electronic AC electric energy measuring system including a portable programmer-reader unit made in accordance with this invention for use with a programmable time registering AC electric energy meter.

Referring now to the drawings and more particularly to FIG. 1, there is shown a block schematic diagram of an AC electric energy measuring system 20 for totalizing usage measurements such as used in billing customers of an electric utility system. A programmable time registering meter 22 includes a microprocessor type metering sequence controller 24 for performing real time based measurements accumulated in different time categories of selected measured parameters of an electric energy flow quantity. A portable data transfer unit referred to hereinafter as a portable programmer-reader (PR) unit 26, forming an important feature of this invention, is provided for performing periodic programming, monitoring and data readout of the meter 22.

Voltage V and current I components of an electric energy flow quantity are supplied to an electric energy transducer 28 of the meter 22. A suitable type of the transducer 28 includes a pulse initiating type induction watthour meter or an electronic electric energy to pulse rate converter such as described in U.S. Pat. No. 4,182,983 issued Jan. 8, 1980 To Heinrich, et al., and assigned to the assignee of this invention. The transducer 28 supplies energy related pulses 30 to the metering sequence controller 24 as described in the abovei-dentified U.S. Pat. No. 4,197,582. The energy related measuring pulses 30 have quantized values of electric energy equal to the time integral of the product of the V and I components produced by the transducer 28. Thus, pulses 30 have a pulse rate or frequency proportional to the rate of electric energy usage or consumption as represented by the analog values of the V and I components typically having a sixty Hz frequency. Certain inventive features of the PR unit of this invention are also utilized with a multidial register kilowatthour meter having a timed schedule of measurement. A metering sequence controller selectively controls totalizing energy usage during different time categories on separate dials as disclosed in the application Ser. No. 891,997.

The controller 24 is operated by fixed program memory provided in a read only memory (M-ROM) 32 integrally associated with the controller 24 for defining the sequence of program instructions for operation of the meter 22. The fixed program memory is operable with replaceable and alterable program control data stored in a random access memory module (M-RAM) 34. The control data selects measuring of electric energy consumption in at least two energy parameters such as kilowatt demand and kilowatthours, for example, to be accumulated in at least three variably fixed time categories. Selection of the time categories usually corresponds to the time periods when peak, intermediate and base levels of electric power loads are being supplied by an electric utility or AC power supplying system. These different power demand periods vary during each weekday, weekend days, holidays and season times, for example. Therefore, the times for change or setpoints between the different measuring time categories are alterble and one of various measuring or billing rate selection schedules is programmed into the replaceable meter program control data area of M-RAM. Further, certain meter constants and calculation factors also must be programmed into the control data, such as for indicating the quantized energy value of each of the pulses 30. Real time and date data are generated by the sequence controller 24 in cooperation with a timer circuit 36 and are stored in M-RAM. Accordingly, the generally described above data items of the meter control data are stored in an externally accessible memory area of the M-RAM 34.

The timer circuit 36 generates timing signals which are regularly occurring electronic signals for calculation and recording of real time and date data by the controller 24, as also mentioned in the aforementioned application Ser. No. 891,997. A meter display 40 provides a visual readout of the energy usage parameters calculated and measured by the meter 22 in different time categories, corresponding to the peak, intermediate, also referred to as mid-peak or shoulder peak, and base rate time categories. Real time and date data are calculated and also stored in the M-RAM 34. As also described in the aforementioned references, an external data communication interface 42 is provided for communicating external electronic data signals into and from the sequence controller 24.

The PR unit 26 is included in the measuring system 20 for operating with the programmable meter 22 in alternative modes of operation including supervisor, reprogram, and read modes under manual control of an operator. The PR unit 26 initializes the meter 22 by transmitting thereto the control data so the meter is initially set-up for operation. The PR unit 26 also reads the time related accumulation of meter measured data and checks the meter control data under field conditions. Meter time and date data verification and synchronization and certain data checking and error detection are provided by the PR unit 26. Accumulation of plural meter accumulated data and retransmitting such accumulated data in a modified form for mass data acquisition or transmission to a distant data receiving station are further provided as the PR unit 26 is further described as generally shown in FIG. 1, hereinafter. The sequence of operations of the meter 22 during a communication cycle of operation with the PR unit 26 is described in U.S. patent application Ser. No. 25,647 for a Time Registering Programmable AC Electric Energy Meter Having Electronic Accumulators and Display, filed concurrently with this application and assigned to the assignee of this invention, and is incorporated herein by reference.

The PR unit 26 includes as a principal element thereof, a microprocessor based sequence controller 46 having an external data input-output connected with an external data communication interface 48 including an optical probe mating with the external data interface 42 of the meter 22, at an outer meter enclosure surface represented by the broken line 52, for communicating through an applied link as more fully described in the aforementioned application Ser. No. 891,997. A programmable read only memory module (PR-PROM) 54 includes a plurality of PROM units or chips, described further hereinbelow, which include replaceable PROM chips having different sets of replaceable and alterable meter control data as also described further below. A PR-PROM 55 includes fixed program memory for providing program instruction controlling the sequence of operation of the controller 46.

A PR-PROM 54 includes part of the replaceable meter control data in a semipermanent condition, in one preferred embodiment, as ten sets or tables of meter rate selection schedules and ten sets or tables of meter constants, both also referrred herein collectively as constant meter control data, with one set of each of the sets being selectable for communication to the meter 22 and entry into the replaceable memory area of M-RAM 34. A read/write memory of the PR unit 26 is formed by the random access memory module (PR-RAM) 56, including two RAM sections 56a and 56b in FIGS. 2A and 2B. Data memory registers in PR-RAM 56 include those for recording reference real time and date data as calculated by the sequence controller 46. PR-RAM 56 also includes three meter data memory areas for meter data transmitted between the PR unit 26 and meter 22 through the bidirectional interfaces 48 and 42. The PR-RAM meter data areas are data images of the replaceable and alterable control data stored in M-RAM 34. The meter control data includes fixed or constant meter control data including the aforementioned rate selection schedule and meter constant data as well as variable data including the meter measured values of the parameters measured in the different time categories, the real time and date data, and certain verification and error checking data. One of the meter data areas of PR-RAM 56 includes meter programming input data and the other two meter data areas of PR-RAM 56 are defined as first or new and second or old meter output data. The meter input data in PR-RAM 56 stores selected ones of the sets of constant meter control data of the replaceable PR-PROM chips 54.

The first or new meter output data of PR-RAM 56 is received for storing and verifying the freshly reprogrammed meter data. The second or old meter output data, is received for monitoring and reading existing or currently operating meter data. The PR-RAM 56 also includes program control flag registers noted below. The PR-RAM 56 further includes memory in a PR-RAM 56b for field collection of many meter readings and storage in a mass data memory area. The readings can be readout directly to billing equipment or transmitted over a communication line.

A timer circuit 60 sends regular signals or pulses such as at a one Hz or one pulse per second repetition rate to the controller 46 to calculate and update the reference clock time and date and calendar data within the PR unit 26. A power supply circuit 61 supplies the circuits of the PR unit 26 from a battery 62 which may be of a rechargeable type so that the battery may be reused after self-powered operation of the PR unit 26 in the field. A battery charger 65 is shown for periodic charging of the battery 62. The power supply circuit 61 is operable to continuously energize the PR-RAM memory 56 and timer circuit 60 and selectively energize the higher power consuming circuits of the PR unit 26 as described hereinafter.

A display 63 of the PR unit includes nine numerical digit displays for producing decimal digit readout of selected data items stored in the PR-RAM meter data memories. The data items may originate in the PR unit 26 or be received from the meter 22. Internally generated variable data items of the PR unit includes its own reference time and date data and error indications of comparison between received meter data and stored meter program and synchronizing data of the PR unit 26. A manually operated data entry 64, also shown in FIG. 3, includes a sixteen key keyboard 66. A control switch input 68 to the PR unit 26 includes a mode select switch 70, shown in FIG. 4, for manually selecting either of supervisor, reprogram or read modes of operation. The control input 68 further includes advance and decement display sequence control pushbutton keys 72 and 74 shown in FIG. 3.

A power on logic 76 is responsive to actuation of the key switches of the keyboard 66 of the data entry 64 and to the timer circuit 60 to turn on the sequence controller 46 for certain operations corresponding to the commands of the actuated one of the key switches of the data entry 64. The display 63 is responsive to a display timer power control function of the logic 76 in controller 46 such that the display 63 is turned on only for a predetermined time period of six seconds and then turned off for conservation of the battery 62 of the power supply 61.

The meter programming and readout functions of the PR unit 26 are related to different data items, defined hereinbelow, principally including the aforementioned meter program control data stored in the PR-RAM 56. The data items are visually read out in the nine numerical digits of the display 63. A display identification (ID) number is associated with each data readout at the display 63 such that each display ID corresponds to a designated data item. The data items have the corresponding display ID numbers thereof arranged in a predetermined sequence so that the data items may be displayed by simply operating the advance or increment and/or decrement or roll-back key switches 72 and 74 also provided on the keyboard 66 shown in FIG. 3. The displayed data item may be directly accessed by command from the keyboard 66 by entering the associated display ID number therein.

A further feature of the PR unit 26 is a data transfer module 78 having an output for an asynchronous serial data transmission such as receivable by a teletypewriter printer. The module 78 permits transferring multiple meter data readings stored in the mass data memory areas of PR-RAM 56 after being received from a plurality of different meters, each corresponding to the meter 22. The output of the module 78 is suitable for retransmission via a long distance communications link such as a telephone line or by direct input to a computer or data recording or a teletypewriter printer device indicated by the numeral 80 in FIG. 1.

Figure 3:
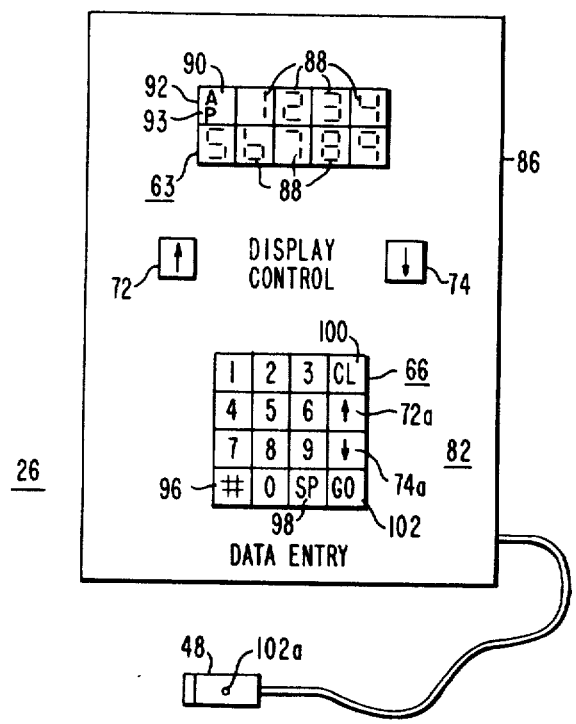
FIG. 3 is a front elevational view of a front panel of a housing for the programmer-reader unit.
Figure 4:
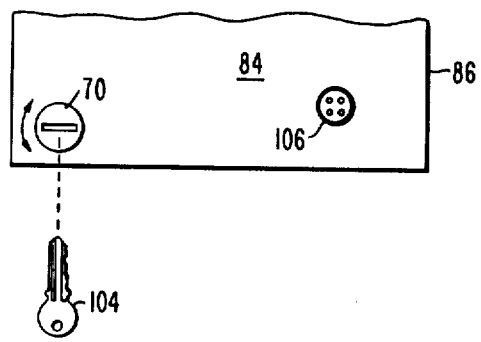
FIG. 4 is a fragmentary rear elevational view of a rear panel of the housing shown in FIG. 3.

Having generally described the arrangement and function of the PR unit 26 hereinabove but before describing in further detail the electrical schematic diagram of FIGS. 2A and 2B, a brief description of the external features of the PR unit 26 is made by referring to FIGS. 3 and 4. Front and rear panels 82 and 84 of a box-like housing 86 for the PR unit 26 is shown in FIGS. 3 and 4 respectively. The housing 86 has a size in the order of five by ten by thirteen inches (12.7×25.4×33 cm) weighing less than 10 pounds (4.5 kilograms). In FIG. 3 the display 63 is shown including nine, seven segment LED digits 88 capable of displaying numerical digits 0 through 9. There are five bottom digits in a row and four top digits in a row above the bottom row each being readable from left to right as viewed in FIG. 3. The word "Error" is also displayed on the bottom row digits. A further display part 90 includes two single LED indicator lights 92 and 93 designated A and P which are alternately energized to illuminate during the twelve am to twelve pm morning period and the twelve pm to twelve am afternoon and evening period since the real time data displayed at the display 63 is on a twelve hour clock time basis.

The data entry keyboard 66 shown in FIG. 3 includes pushbutton switch keys having ten numerical digit keys labeled 0 through 9 as shown. This arrangement is for manually entering coded data into the PR unit 26 on a decimal numerically coded basis. A display advance key 72a is indicated on the keyboard 66 by the upward extending arrow ( ↑ ), as on the key 72, since thye are parallel connected. A decrement key 74a is indicated by a vertically down arrow ( ↓ ), as on the key 74, which is in parallel with the key 74. The keys 72-72a and 74-74a advance and decrement, respectively, the order of a predetermined sequence of data items visually readable at the display 63. The advance and decrement keys 72 and 74 are provided outside the keyboard 66 since in one mode of operation, the keyboard 66 may be made inactive or locked out by the sequence controller 46 when operating in the read and reprogram modes. This prevents use of the keyboard when the PR unit 26 is taken into the field except for one of the keyboard keys noted hereinbelow. A key 96, labeled with a number sign (#) is a control key of the keyboard which when pressed designates that the following entries on the keyboard will be numbers indicating a display ID number corresponding to one of the data items. A key 98 is labeled in SP and is available as a step key to provide a further control key which is to designate that the numeric data entry on the keyboard subsequent to it being actuated is to be a further function command to the PR unit. A key 100 labeled "CL" is a clear key and when actuated clears any previous keyboard entries occuring immediately before the pressing the clear key 100. Any operation in progress is terminated by the key 100 and causes the readout on the display 63 to be blank. The key 100 remains operative to permit its use during all modes including in the field. It is to be further noted that the advance keys 72–72a advance the display readout sequence one step and also activate the display for the next reading and the decrement keys 74–74a decrement the display readout sequence one step and activate the display for the previous reading.

A key 102 is labeled "GO" and is provided to initiate communication with the meter 22 through the data interfaced 48 and 42 when they are aligned for data transfer between the PR unit 26 and the meter 22. A pushbutton key 102a, shown in FIG. 1, is also a GO key connected in parallel with the key 102. The communication interface 48 includes an optical probe carrying the GO key 102a. The probe is described in more detail in the aforementioned application Ser. No. 891,997.

A fragmentary view of the lower half of the rear panel 84 of the PR unit housing 86 is shown in FIG. 4. The mode select switch 70 is mounted in the panel 84 so as to be operated by means of a key 104. The switch 70 is rotatable ninety degrees clockwise or counterclockwise from the horizontal position shown by insertion of the key 104. Upon switch rotation, one of the three modes, supervisor, reprogram or read operating modes is established. Removal of the key 104 from the switch 70 prevents unauthorized change in the mode of operation. An electrical socket 106 is further provided at the rear of the housing in the panel 84 for receiving a connector, not shown, attached to a cord including separate conductors for connection with the battery charger unit 65, shown in FIG. 1, and for connection with the teletypewriter 80 or other external communications equipment or lines.

Figure 2A:
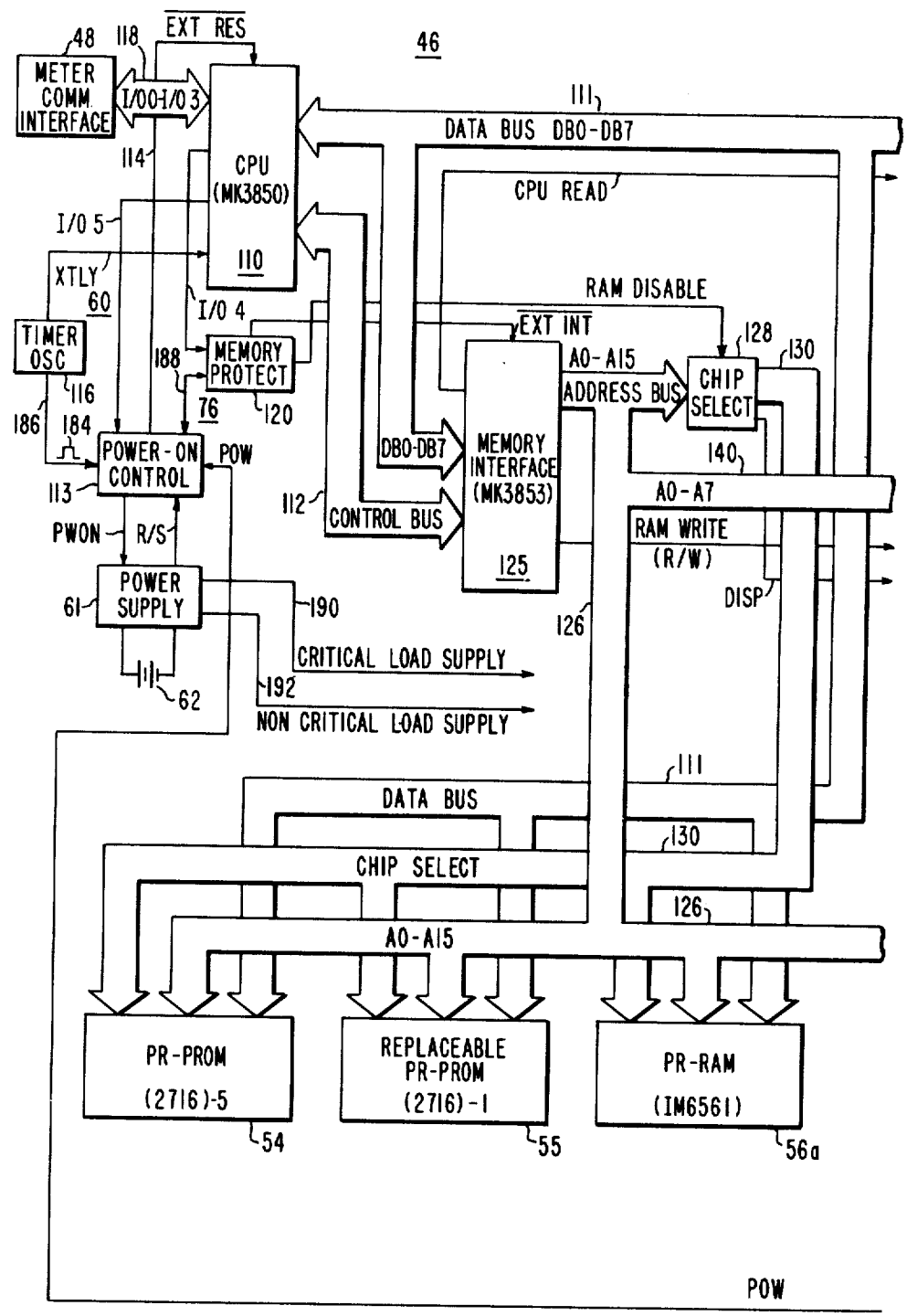
FIGS. 2A and 2B are an electrical schematic diagram of the portable programmer-reader unit shown in FIG. 1.
Figure 2B:
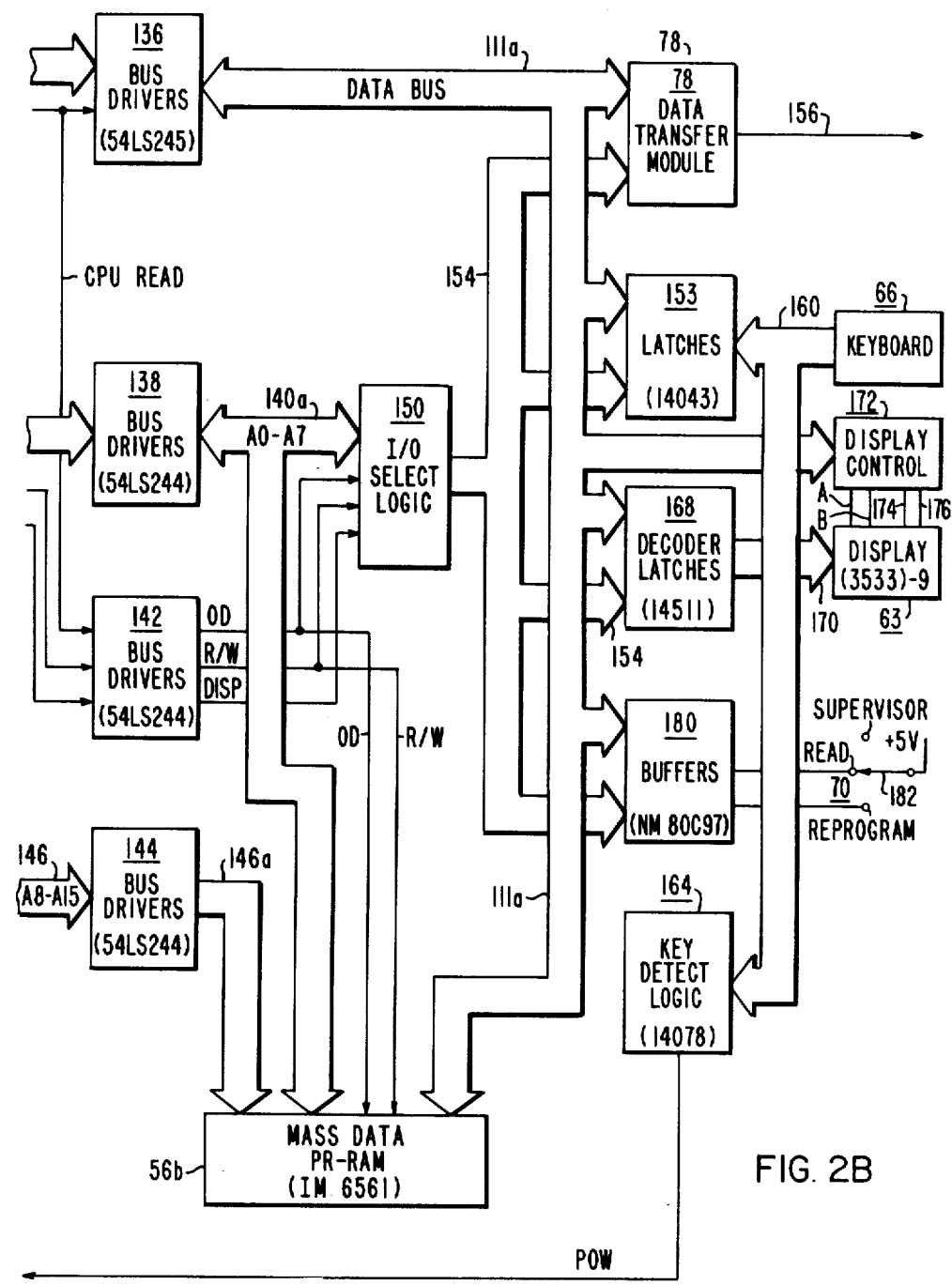

Referring now to the electrical schematic diagram of the PR unit 26 shown in FIGS. 2A and 2B, the microprocessor based sequence controller 46 is formed by a CPU (central processing unit) 110 type MK3850 microprocessor CPU available from Mostek Corporation, Carrollton, Texas 75006. Eight data bit logic lines DB0 through DB7 are included in the system data bus 111 for providing data inputs and outputs at the CPU. The CPU WRITE and $\phi$ clock lines, interrupt request $\overline{INT\ REQ}$, and control lines ROMC 0 through ROMC 4 include control logic lines in a control bus 112. An external reset $\overline{EXT\ RES}$ logic input is provided from a power-on control circuit 113 included in logic 76, as described further hereinbelow. An XTLY external clock control line is received from an oscillator 116 which is part of the timer circuit 60 shown in FIG. 1. The four input-output port logic lines I/O 0 through I/O 3 are connected by bus 118 to the communication interface 48. The I/O 4 port logic line is connected to a memory protect circuit 120 which is part of the power on logic 76 with the latter receiving the I/O 5 port logic line at circuit 113 also described further hereinbelow with the description of FIG. 5. A known instruction set is provided for the accumulator, scratch pad register, data counter, status register, program counter, interrupt control and input/output instructions for the CPU 110.

The CPU 110 is connected with a static memory interface 125 being of the type of MK 3853 also available from the aforementioned Mostek Corporation. The CPU 110 and memory interface 125 define a type F8 microprocessor system forming the sequence controller 46 and incorporating static memory systems. The data memory systems include the aforementioned PR-RAM sections 56a and 56b of the PR-RAM module 56 and the two PR-PROM's 54 and 55. The memory interface 125 receives the control bus 112 having the aforementioned control lines wherein the control lines ROMC 0 to ROMC 4 are provided to define the contents of the data bus 111. The memory interface 125 is further connected with the eight data bit logic lines BD0 through DB7 provided on the bus 111. An output of the memory interface includes a sixteen bit address logic lines A0 through A15 provided on a system address bus 126. A $\overline{RAM\ WRITE}$ (R/W) logic line of the interface 125 indicates when data is to be written into memory or to an output device. An $\overline{EXT\ INT}$ logic line provides the external interrupt line input from circuit 120 of the power on logic 76. CPU READ logic line of the interface 125 indicates when the data bus 111 has data to send to the CPU from memory or an input device. The address bus 126 is applied to a chip select logic 128 which provides a chip select bus 130 at the output thereof. A RAM DISABLE logic line is applied to the chip select 128 from memory protect circuit 120. RAM DISABLE prevents data from being written into or read from any of the RAM devices when power is being turned on or off. A DISP output is also provided by the chip select 128. The DISP logic indicates that input/output devices are being accessed including but not limited to the display 63. The logic of the chip select bus 130 selects which memory device is being addressed at any given time.

Referring now to the memory portion associated with the sequence controller 46, the PR PROM 54 includes five type 2716 PROM chips which are programmed with the program memory for operation of the sequence controller 46. The replaceable PR-PROM 55 includes a similar chip of the type 2716 which is capable of being removed or inserted into the PR unit 26 so as to include ten sets of meter constants and rate selection schedules. It is contemplated that a number of PR-PROM's 55 each having a different set of ten rate selection schedules and meter constants will be available for an electric utility so that any desired combination of rate selection schedules and meter constants will be available. The PR-RAM section 56a includes type IM 6561 random access memory chips which include the aforementioned three memories of data images of the meter program control data stored in the M-RAM of meter 22 and including the meter programming input data and the two (new and old) meter output data memories, the time and data memories for maintaining the corresponding data in the PR unit 26 and other data as described further hereinbelow.

Each of the PR-PROM and PR-RAM modules include inputs from the chip select bus 130 and address. The mass data acquisition (MDA) section of the PR-RAM 56b shown in FIG. 2B includes additional random access memory chips of the same type IM 6561 for accumulating the meter reading data of a large number of meters.

The arrangement of the microprocessor forming the sequence controller 46 and the associated program and random access memory have been described hereinabove and now the input and output portions thereof are further described as shown in FIG. 2B. A buffer or bus driver circuit 136 formed by a circuit type 54 LS 245 is connected to the data bus 111 and interconnects with a corresponding data bus 111a connected with the input/output devices of the circuit shown in FIG. 2B. The bus driver circuit 136 further receives the CPU READ logic line. A second bus driver circuit 138, which is of the type 54 LS 244, is connected with one byte of the address bus 126 including address bits A0–A7 provided on the address bus 140. The bus driver 138 interconnects the bus 140 with a corresponding address bus 140a. A third bus driver circuit 142 also includes the circuit type 54 LS 244 and receives the CPU READ logic line, the RAM WRITE logic line and the DISP logic line. The bus driver 142 correspondingly connects the aforementioned data logic lines to provide an OD logic line which is an output disable indicating to memory devices or input devices when to put data on the system data bus and the R/W and DISP are the same as described hereinabove. The bus driver 144 also includes the similar type 54 LS 244 circuit and receives a second byte of the address bus 126 including the address bits A8–A15. The bus driver 144 interconnects the bus 146 with a corresponding eight bit address bus 146a. The PR-RAM section 56b receives the data bus 111a, the two byte or eight bit address buses 140a and 146a as well as the R/W and OD logic lines. An I/O select logic circuit 150 is connected with the address bus 140a and receives the logic lines OD, R/W and DISP. The I/O select logic provides logic signals on a bus 154 to select between the different input and output devices including the display 63, the keyboard 66, the mode switch 70 and the data transfer module 78.

The data transfer module 78 is connected with the data bus 111a and the I/O select bus 154 for providing a parallel to serial data conversion for providing serial binary coded transmissions on the output 156 thereof. A latch circuit 153 is formed by latch circuits of the type 14043 and is connected with the I/O select bus 154 and data bus 111a. The latch circuit 153 receives an input on the bus 160 from the keyboard 66. The keyboard bus 160 is also applied to a key detect logic 164 including a circuit type 14078. The key detect logic 164 effectively provides an AND logic function so that any time a key is depressed on the keyboard 66 an output pulse signal POW is provided from the logic 164. The POW signal is applied as a binary logic input to the power-on control circuit 113 as shown in FIG. 2A. A decoder latch circuit 168 including latches of a type 14511 is connected with the IO select bus 154 and data bus 111a. The circuit 168 provides outputs on a bus 170 to drive the seven segment digit readout circuits of the display 63. Nine digit elements each of a circuit type 3533 provide the seven segment LED numerical digit display elements. A display control logic 172 is associated with the display 63 and receives inputs from the data bus 111a. Outputs from the display control 172 to the display 63 include the am indicator logic on the line designated A and the pm indicator logic is provided on the line indicated by P. The line 174 causes the display 63 to display "Error". Finally, the line 176 from the display control 172 causes blanking of the display 63 and effectively prevents any display thereon.

Circuit 180 includes buffer circuits of a type MM 80C97 connected with the data bus 111a and I/O select bus 154. The circuit 180 receives two inputs designated READ and REPROGRAM which are switch contacts of the mode select switch 70. The key actuated switch arm 182 connects a source of voltage to either READ or REPROGRAM contacts to provide logic inputs to the circuit 180. A third position of the switch 70 labeled SUPERVISOR simply removes any voltage or logic input to the circuit 180 indicating that it is to provide a logic signal on the bus 111a for effecting the supervisor mode of operation for the PR unit 26.

Having just described the input and output devices connected with the sequence controller 46, the power-on logic 76 is now generally described, as shown in FIG. 2A, for controlling the power supply 61 and the controller 46. The timing circuit 60 operation is closely associated with the operation of the logic 76 for producing the timing signals occurring at the $\overline{\text{EXT INT}}$ logic line for real time and date data keeping. The power supply 61 includes the battery 62 which is rechargeable and which is required to supply the entire power for operating the PR unit 26 in the field for long periods of time such as up to twenty hours. Accordingly, the power supply 61 continuously supplies a power output 190 for critical loads which must be supplied continuously. These loads include the PR-RAM sections 56a and 56b and the timer oscillator 116. This is required to preserve the volatile memory of the PR-RAM's and enable the timer oscillator 116 to provide regular signals which are counted by the sequence controller 46 to provide a reference time and date record function. The display 63 is also supplied from line 190 because a display timer only allows short operational cycles thereof. All other non-critical loads are supplied by the power supply 61 on the line 192. The power-on control circuit 113 of logic 76 provides a logic signal PWON to the power supply 61 which is effective to turn on and turn off the power supplied by the line 192.

All of the operations of the PR unit 26 have programmed timed durations. After each of the functions is completed the non-critical load supply line 192 is deenergized for maximum conservation of the stored energy of the battery 62. The circuits supplied by the critical load supply line 190 are very low power consuming devices and do not significantly use the energy of the battery 62 in comparison to the power required for performing the external input and output operating functions of the PR unit 26. A power ready sensing (R/S) logic line is provided from the power supply 61 to the control circuit 113 in response to the energized and deenergized state of the non-critical load supply line 192. The $\overline{\text{EXT RES}}$ line from the logic 76 releases the reset at the external reset input of the CPU 110. As mentioned hereinabove the logic 76 receives the POW logic signal from the key detect logic 164, shown in FIG. 2B, and logic 76 further receives a timing signal 184 on the line 186 from the timer oscillator 116. Either the POW logic signal or the timing signal 184 initiates a power on cycle of operation at the logic 76. The other output of the timer oscillator 116 applies high frequency signals that the XTLY input of the CPU to provide clocking signals thereto.

The I/O 5 output logic signal is applied to the power-on control circuit 113 and the I/O 4 output logic signal is applied to the memory protect 120 which is interconnected, as indicated by the line 188, with the control circuit 113. The memory protect 120 assures that the RAM DISABLE is not released until the outputs of the CPU 110, which are connected with the PR-RAM's, are stabilized to predetermined logic states which may vary during an initial power on and off sequences of operation. The $\overline{\text{EXT INT}}$ is applied from the memory protect 120 after a controlled delay sequence following the receipt of a timing pulse 184. This assures the CPU 110 has been turned on and has completed its power-on initialization before receiving an interrupt signal for incrementing the time keeping memory counters associated with the real time and date accumulation. The minimum power consuming operation and memory protecting operation is described hereinafter in connection with the description of FIG. 5.

Figure 5:
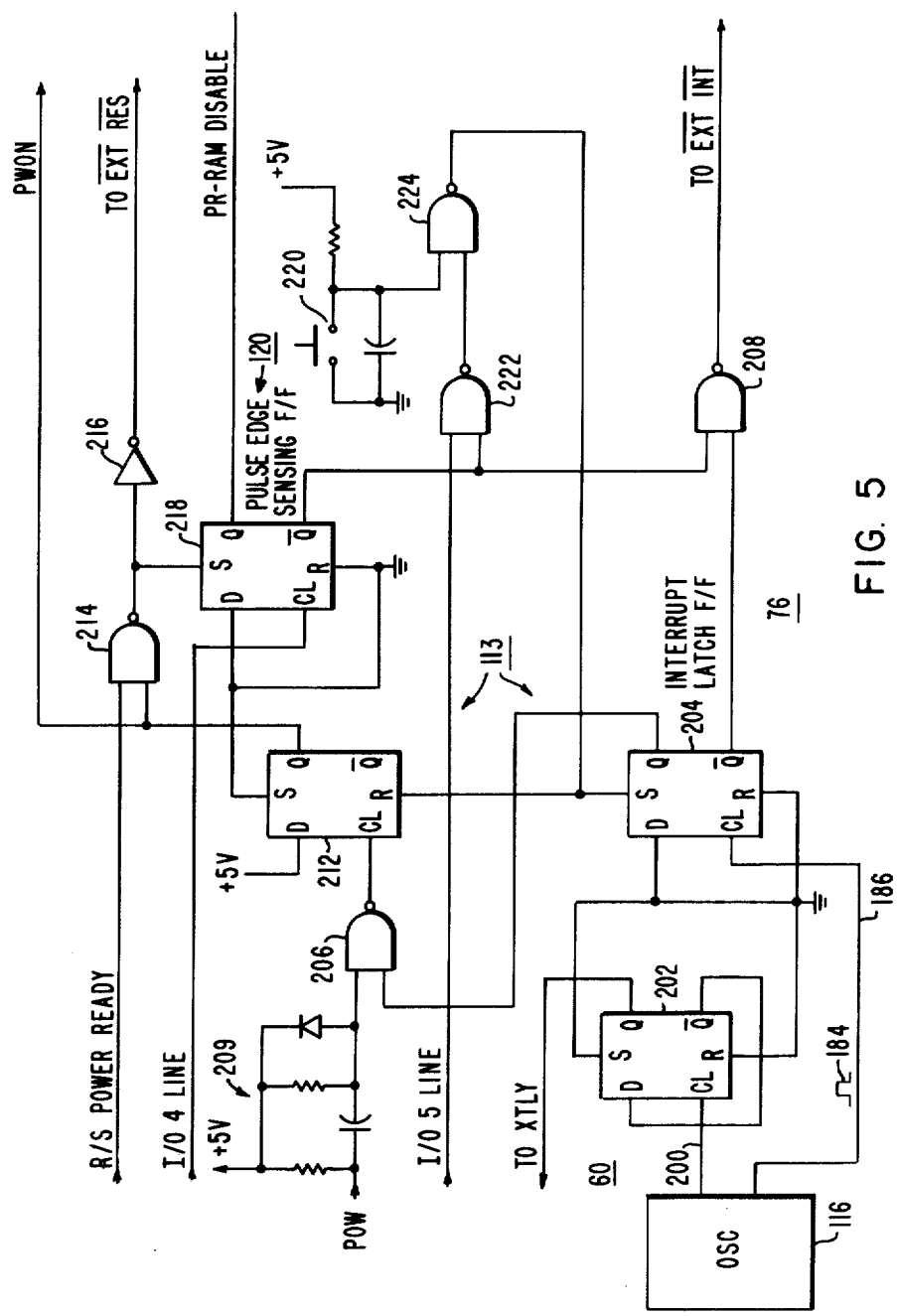
FIG. 5 is a detail electrical schematic diagram of a power on logic portion included in the electrical diagrams of FIGS. 1 and 2A.

The power-on logic 76 with the circuit 113 and the memory protect 120 and also the timer circuit including the oscillator 116 is shown in FIG. 5. The circuit of logic 76 controls the pulsing of power to the CPU 110 and memory interface 125 from the supply line 192 in response to the timing signals 184 to perform the time and date keeping operations and then powering down. The circuit further controls a power-on to the supply line 192 in response to a POW logic produced when one of the keys of the keyboard 66 are depressed and also delays the release of the RAM DISABLE logic until after the CPU and memory interface have completed power-on initialization. The circuit in FIG. 5 includes four D type flip flops and five NAND gates as shown. The oscillator 116 provides high frequency signals on the line 200 which are applied to the first flip flop 202 having a Q output connected to the XTLY clock line applied to the CPU 110 as shown in FIG. 2A. The oscillator output line 186 produces the timing signals 184 having a predetermined regular rate which in one preferred embodiment is one Hz. The pulses 184 are applied to the clock CL input of an interrupt latch flip flop 204. The Q output of flip flop 204 is applied to one input of the gate 206 and the Q output is applied to a NAND gate 208. The other input to the gate 206 is received from the POW logic line applied to a pulse delay or one shot type circuit 209. The circuit 209 produces a single pulse in the POW signal being applied to the gate 206 even if a key of the keyboard 66 is inadvertently held depressed. The logic at the inputs of the gate 206 are normally high so that either a POW logic signal or a timing signal 106 causes the gate output to go high. The clock input of a flip flop 212 receives the output of the gate 206 and produces at its Q output the PWON logic which is sent to the power supply 61 shown in FIG. 2A to effect energization of the non-critical load supply line 192. The PWON logic is also applied to a NAND gate 214 which also receives the power ready signal (R/S) from the power supply 61 indicating that the line 192 has received its energizing potential. The output of the gate 214 is applied to an inverter 216 to produce the $\overline{\text{EXT RES}}$ input to the CPU 110. The external reset then releases the operation of the CPU 110 and memory interface 125 and it begins its power-on initialization operation in accordance with the fixed program sequence of instructions therein.

The I/O 4 logic line of the CPU 110 is applied to a pulse edge sensing flip flop 218 at the clock CL input thereof. The I/O 4 line goes from low to high when the CPU 110 has completed its power-on initialization sequence of operation. The low to high transition triggers the flip flop 218 to set the Q output thereof to high and release the PR-RAM DISABLE logic applied to the chip select 128. A reset switch 220 applies a high logic state to the set input of the flip flop 212 and to the reset input of the flip flop 204 to restore the system to its normal state, awaiting a pulse 184 or a signal on the POW line. When the $\overline{\text{EXT RES}}$ output is initiated by the gate 214, the flip flop 218 is released at the set input thereof. Thereafter the input from the I/O 4 logic line is able to change the state of the flip flop 218. Accordingly, the power-on control circuit 113 and the memory protect 120 energize the non-critical loads and enable the PR-RAM's so that the circuits shown in FIG. 2A are fully operational.

The power-on condition is always controlled by timed operation of the sequence controller 46 and when such time operation is completed, an output is applied to the I/O 5 logic line. This is done by the power-down PWDN program routine referred to later in connection with description of the flow charts pertaining to the operation of the circuits shown in FIGS. 2A and 2B. The I/O 5 logic line goes high when the CPU 110 is signalling that a power-down routine is to commence and this is applied to the NAND gate 222. The $\overline{Q}$ output of the flip flop 218 enables the gate 222 so that it has an output applied to the gate 224 which applies an output to the set input of the flip flop 204 and the reset input of the flip flop 212. The Q output of 212 reverses the logic state of the PWON logic signalling the power supply 61 to remove power from the supply line 192. Simultaneously, through the gate 214, the $\overline{\text{EXT RES}}$ is activated, to maintain control of the CPU 110 during power down. This also causes the flip flop 218 to then effect the RAM DISABLE logic to the chip select 128, protecting the memory.

Briefly, reviewing the operation of the circuit shown in FIG. 5, it is seen that initially either the timing signal 184, occurring at one second intervals, or a key input at the keyboard 66 produces a POW logic signal. This sends out a PWON logic to the power supply 61 to effect energization of the non-critical load supply line 192. In response thereto, the R/S input effects the release of the $\overline{\text{EXT RES}}$ logic at the memory interface 125 and the CPU begins its power on initialization cycle of operation. The RAM DISABLE logic prevents any random data signals from reaching the PR-RAM's 56a and 56b waiting until the I/O 4 logic line goes high signalling that the CPU power-on initialization has been completed. When this occurs when the RAM DISABLE enables the RAM memory the external interrupt is enabled and the logic circuit is enabled to receive a power-off signal when the logic of the I/O 5 logic line goes high. The CPU 110 initiates its power-off cycle, which is at the end of an operation, and occurs even if there is a display at the display 63 which is automatically timed to turn off after a predetermined time of no longer than six seconds. The flip flops of the circuit shown in FIG. 5 are reset by the input on the I/O 5 logic line so as to protect the RAM memory during both power turn on and off and cause resetting of the CPU 110.

Control of the sequences of operations of the sequence controller 46 is provided by the instructions of the fixed program stored in the PR-PROM 54 to produce the operations of the PR unit 26 as described more fully in connection with the description of the flow charts hereinbelow. The system addresses of the fixed program and random access memory areas and the addresses of the input and output circuits are defined in a Table I hereinafter.

TABLE I

| MEMORY MAP | | |
|---|---|---|
| Address (Hexadecimal) | Contents | Type |
| 0000-7FF | Program | PROM 54 |
| 0800-806 | Time and Date | RAM 56a |
| 0807-839 | Program Control Flag and | RAM 56a |

TABLE I-continued
MEMORY MAP

| Address (Hexadecimal) | Contents | Type |
|---|---|---|
| | Scratchpad Memory | |
| 0900-97F | Old Date Received from Meter | RAM 56a |
| 0980-9FF | New Data Received from Meter | RAM 56a |
| 0A00-A7F | Data to be sent to Meter | RAM 56a |
| 0C00-C01 | Keyboard Input 66 | Latches 158 |
| 0C02 | Mode Key Switch 70 | Buffers 180 |
| 0C03-C07 | Display and Control 63 and 172 | Latches 168 |
| 0C08-C0F | Data Transfer Module 78 | Latches |
| 1000-1FFF | Program | PROM 54 |
| 3000-30FF | Meter Constant Data Tables | PROM 55 |
| 3100-37FF | Rate Schedule Data Tables | PROM 55 |
| 4000-FFFF | Mass Data Storage | RAM 56b |

The three memory areas of PR-RAM 56a listed in Table I include the meter program control data and the old and the new meter data which are data images of the replaceable and alterable meter control data stored in the M-RAM 34 having corresponding addressed shown in Table II below. The PR unit 26 has access to the data items of the control data in M-RAM 34 and this data is listed in a Table III hereinbelow according to numerical designations for the data items for purposes of the present description of the PR unit 26 of this invention. Memory addresses in M-RAM 34 are provided for each of the data items listed in Table III which includes the associated mnemonics, brief descriptions and bit designations of the data items. The meter data of Table III has three equivalent data images in the memory locations of PR-RAM 56a at PR-RAM memory address locations listed in Table II for the three meter data memory areas. Thus, the meter data items have M-RAM 34 memory addresses corresponding memory storage beginning at the addresses 0900, 0980 and 0A00. The Tables II and III are as follows:

TABLE II

| METER-RAM ADDRESSES | PR-RAM ADDRESSES (HEX) | | |
|---|---|---|---|
| | Old Meter Data | New Meter Data | Meter Program |
| M-RAM Addr 1 | 900 | 980 | A00 |
| | to | to | to |
| to | 94E | 9CE | A4E |
| | 94F | 9CF | A4F |
| | to | to | to |
| M-RAM Addr N | 97F | 9FF | A7F |

TABLE III
MEMORY MAP OF METER DATA

| DATA ITEM | MNEMONIC | DATA DESCRIPTION |
|---|---|---|
| 1 | SCNT | Seconds Counter-Six bit binary counter, counts down from 60 to 0 at 1 count per second rate. |
| 2 | MCNT | Minutes Counter-Six bit binary counter, counts down from 60 to 0 at 1 count per minute. |
| 3 | HCNT | Hour Counter-Five bit binary counter, counts down from 24 (starting at 12:00 midnight) to 0. |
| 4 | MP | Pulse initiator constant-1 bit binary constant. Set to 0 for MP = 2 (two pulses per disc rev.). Set to 1 for MP = 4. |
| 5 | YR 1 | Day of Year 1-2 BCD digits for the day of the year counter. |
| 6 | YR 2 | Day of Year 2-One half a BCD digit for the hundreds digit of day of year. |
| 7 | LP 0,1 | Leap year counter-2 bit binary counter. Counts a 4 year cycle with 00 indicating leap year. |
| 8 | DOWK | Day-of-week counter-three bit binary counter, counts down from 7 (Sunday) to zero. |
| 9 | PLSFLG | Pulse Initiator Flag-Bit indicates status of the pulse initiator inputs. |
| 10 | PIBIT | Pulse Initiator Flag-Bit indicates status of the pulse initiator output. |
| 11 | DAY CHG. | Day Change Flag-Status Bit is set to 1 when clock time changes from 11:59:59 pm to 12:00:00 midnight. |
| 12 | 7/365 | Calendar Flag-Control Bit which determines calendar cycle. When set to 1, the register repeats a 7 day cycle. When set to 0, it runs on a 365/366 day, 4 year cycle. |
| 13 | DSTS | Daylight Savings Time Set-Status bit which is set to 1 at midnight of DST start day and reset at 2:00 a.m. when actual DST adjustment is made. |
| 14 | DSTR | Daylight Savings Time Reset-Status bit serving similar function as described for DSTS except used when going from DST to standard time. |
| 15 | HLDY | Holiday-Status bit, set to a 1 at midnight of start of holiday as defined in data table. Bit is reset to zero at the end of the day. |
| 16 | SUM/WIN | Summer-Winter-Status bit, set to 1 at the start of the "summer" rate schedule season and reset to zero at the start of the "winter" season. |
| 17 | HADR | Holiday Address-8 bit address which points to the RAM location of the next holiday, DST change or season change to be encountered. |
| 18 | DPFLG | Bits are control flags to enable the display for a given quantity. A 0 bit inhibits the display and a 1 enables. The flag bits are: Day of Year (DAYR) Total KWH (TKWH) Peak KWH (PKWH) Shoulder KWH (SKWH) Base KWH (BKWH) Peak KWD (PKWD) Shoulder KWD (SKWD) Base KWD (BKWD) |
| 19 | RPKWD | Maximum KWD, Peak Rate-Represents the maximum KW demand metered during the peak rate periods but subsequent to the last external reset operation. |
| 20 | RSKWD | Maximum KWD, Shoulder Rate-Similar to RPKWD except applies to shoulder rate periods. |
| 21 | RBKWD | Maximum KWD, Base Rate-Similar to RPKWD except applies to base rate periods. |
| 22 | RTKWH | Total KWH-Represents the cumulative KWH registered by the meter. |
| 23 | RPKWH | Peak Rate KWH-Similar to RTKWH except cumulative KWH consumption is during the peak rate periods only. |
| 24 | RSKWH | Shoulder Rate KWH-Similar to RTKWH except KWH consumption is during shoulder rate periods. |
| 25 | RBKWH | Base Rate KWH-Similar to RTKWH except KWH consumption is during the base rate periods. |
| 26 | CPKWD | Cumulative KWD, Peak Rate-Cumulative KW demand metered during the peak rate periods. Format is similar to RPKWD. |
| 27 | CSKWD | Cumulative KWD, Shoulder Rate-Similar to CPKWD except metered during the shoulder rate periods. |
| 28 | CBKWD | Cumulative KWD, Base Rate-Similar to CPKWD except metered during the base rate periods. |
| 29 | TDINT | Time of Demand Interval-This is an 8 bit counter which represents the |

TABLE III-continued
MEMORY MAP OF METER DATA

| | | |
|---|---|---|
| 30 | INTDEM | elapsed time in the current demand interval. It counts down in 1 minute increments.<br>Current Interval Demand-This represents the demand accumulated during the current interval. It is reset at the end of each demand interval. The format is similar to RPKWD. |
| 31 | TKWH | Fractional KWH-This is a 20 bit binary count which represents the pulses counted but which do not equal a full KWH. |
| 32 | TKWD | Fractional KW Demand-This is a 20 bit binary count which represents the pulses counted but which do not equal a full 1/100 of a kilowatt. |
| 33 | BTLOG | Battery Use Log-Represents the elapsed time which the unit has operated on battery power. This is a 20 bit binary number. Each count equals 4 seconds of battery operation. |
| 34 | LDCR | Load Control-Control bit for the load control function. This is programmed to a 1 if the relay is to be used as a load control output relay. |
| 35 | MIN CHG. | Minute Change-Flag bit is set when SCNT counts down to zero or when the register is accessed by the Programmer Reader. The next pass through the main program updates the minutes count and clears this bit. |
| 36 | PIFLG | Pulse Initiator Flag-Control bit for the pulse initiator function. This is programmed to a 1 if the relay is to be used as a pulse output. |
| 37 | NCODE | New Code (Security)-This is a "random" BCD number which is generated by the register each time it is read. It may be used to detect tampering. |
| 38 | OCODE | Old Code (Security)-This is the binary word from the NCODE location above which is moved to the OCODE location each time any register value is changed (including time and date). |
| 39 | TORSP | Top, Rate Switch Points-This is an 8 bit address which points to the external RAM location which contains the first word of the rate switch point table. |
| 40 | TPADR | Top, Address, Date Table-This is an 8 bit address which points to the external RAM location which contains the first word of the date table. |
| 41 | RIDC | Rate Identification Code-This is a 4 bit BCD number assigned to a given set of rate schedule data. |
| 42 | MIDC | Meter Constant Identification Code-This is a 4 bit BCD number assigned to a given set of meter constant data. |
| 43 | METID | Meter Identification-This is a 9 digit BCD constant assigned to uniquely identify a given register. |
| 44 | XFMR | Transformer Ratio-This is a 7 digit BCD constant which represents the metering transformer ratio used with a given register. The register KW and KWH readings are multiplied by this value to obtain primary readings. |
| 45 | KE | Meter KWH Constant-This is the constant which the register uses (together with the multiplier defined by KWHM) to convert input pulses to KWH readings. KE is stored as a negative, 12 bit, binary integer. |
| 46 | KWHM | Meter KWH Constant Multiplier-This is a 4 bit binary number which points to the decimal multiplier for KE as follows: |

| KWHM | Multiplier |
|---|---|
| 0 | 10 |
| 3 | 100 |
| 6 | 1000 |
| 9 | 100000 |
| 12 | 1000000 |
| 15 | 10000000 |

| | | |
|---|---|---|
| 47 | DINT | Demand Interval-This is a constant which sets the time period or length of the demand interval. It is an 8 bit binary number. |
| 48 | KD | Meter KWD Constant-This is analagous to the KE constant and is used to convert pulses to KWD readings. |
| 49 | KWDM | Meter KWD Constant Multiplier-This analagous to the KWHM multiplier except it is applied to the KD value. |
| 50 | CHKSM | Check Sum-This is a check sum consisting of two hex digits, used to verify the meter constants. |
| 51 | RATE SWITCH POINTS | Remainder of RAM-The remainder of the RAM locations are used as a buffer for storing rate switch point data and dates. There are 120 four bit words available and the buffer can be made up of any combination of switch points (4 words each) and dates (3 words each). The format for these items is specified below. The starting address for the switch points is defined by TORSP and the dates start at the location specified in TPADR. |
| 52 | AND DATE CODES | |

Rate Switch Points - 4 words each.
Switch points for each type of day are arranged in chronological order in contiguous locations of RAM.
    Type of Day code:
        00 = Weekday
        01 = Saturday
        10 = Sunday
        11 = Holiday
    Load Control bit:
        0 = off
        1 = on
    Season
        0 = Season 0
        1 = Season 1
    Unused (set to 0)
    Rate Code:
        00 = Base
        01 = Shoulder
        10 = Peak
        11 = (Unused)
    Hour Code:
        The five bits specify the hour of the day the rate switch is to occur counting down (in binary) from 24 to 0.
    Minutes Code:
        These four bits specify the number of minutes after the hour when the rate switch is to occur. It is a binary number which counts down from 60 to 0 in 5 minute increments.
Date or Holiday Coding - 3 words each.
Note: Dates must be arranged in chronological order in contiguous locations of the RAM:
    Word 0 -
        Four bit BCD digit representing the LSD of the day of the year.
    Word 1 -
        Four bit BCD digit representing the ten's digit of the day of the year.
    Word 2 -
        Two bit binary digit representing the hundred's digit of the day of the year.
    Word 3 -
        Day code (defines the significance of the date):
            00 = Holiday date
            01 = DST Set Date
            10 = DST Reset Date
            11 = Season Change Date Display identification (ID) numbers are used to designate certain ones of the data items listed in the Table III hereinabove. A Table IV is provided hereinbelow listing the ID number and the data item associated with the ID number. The display ID numbers, which, designate certain ones of the data items of Table III, serve several predetermined functions in accordance with the operation of the PR unit 26 of this invention. First, the two digit ID numbers are displayed on two of the digits of the display 63 so that the numbers which are displayed at other of the digits of the display 63 are identified as the data content of the identified data item. A second function of the ID numbers is provided when the PR unit 26 is in the supervisor mode for entering new meter program data into the PR unit 26 for subsequent transfer to the meter M-RAM 34. After a two digit ID number is entered at the keyboard 66, the sequence controller will enable the address of the data item in the meter program area of PR-RAM beginning at the address 0A00. The data content at the latter address is changed by the entries at the keyboard 66 immediately following entry of the ID number. The contents of the meter program memory area are transferred to the areas of the M-RAM 34 upon communication with the meter through the interfaces 42 and 48.

A further function of the display ID numbers is that the contents of the three meter data memory areas in PR-RAM are designated by a common display ID number which may be visually read out from any of the three PR-RAM memory areas to the display 63. The display selector ID number 72 indicated in Table IV is entered at the keyboard 66 and then if one of the 0, 1 or 2 numbers are entered at the keys of the keyboard 62, the display 63 will display the meter data images in the old memory data memory area starting at the address 0900, or the new meter data memory area beginning at the address 0980, or the program meter data to be sent to meter beginning at the address 0A00, respectively. If no entries are made for the display selector quantity then the PR unit 26 is automatically set to display the old meter data at the address 0900 and following. The sequential order of the ID numbers is significant since by depressing the advance keys 72 or 72A the data item being displayed at the display 63 will change to the next higher number of an ID number to display the associated data item. Similarly, pressing of the decrement key 74 will cause the previous ID number to the presently displayed ID number to be displayed with its associated data item. In the read mode of operation of the PR unit 26, sixteen quantities are displayed. If an error is detected first, "Error", is displayed with an associated error number. If there is no error then the following fifteen items are displayed starting first with the meter identification number wherein all nine digits of the display 63 are used. The third through sixteen steps of the read mode display sequence starts with the display identification number 53 and the following ID numbers through and including the ID number 68 are visually displayed by simply depressing the advance key 72 or decrement key 74. It is to be noted that normally during the read mode of operation the keyboard 66 is not available or capable of being used except for the clear key 100. The Table IV of the display ID numbers is as follows:

TABLE IV

DISPLAY IDENTIFICATION TABLE

| ID No. | Data Item | Quantity |
|---|---|---|
| 00 | 43 | Meter ID # |
| 01 | 44 | Transformer Ratio |
| 02 | 45 | Kh |
| 03 | | Unused |
| 04 | 36,47 | Relay Control Flag/Mp/Demand Interval |
| 05 | | Unused |
| 06 | 12,18 | Calendar Flag/Display Flags |
| 07 | | Unused |
| 08 | | Unused |
| 09 | 39,40 | Number of Holidays/Number of Date Set Points |
| 10 thru 49 | 51 and 52 | Set Points (4 words) from a first to last Set Point and Holidays (3 words from a first to a last Holiday are programmed for a desired Rate Selection Routine using this 120 word memory area |
| 50-52 | | Unused |
| 53 | 22 | Total KWh |
| 54 | 23 | Peak KWh |
| 55 | 24 | Shoulder KWh |
| 56 | 25 | Base KWh |
| 57 | 26 | Peak Demand |
| 58 | 27 | Shoulder Demand |
| 59 | 28 | Base Demand |
| 60 | 38 | Old Security Code |
| 61 | 37 | New Security Code |
| 62 | 33 | Battery Use Log |
| 63 | 2,3 | Time according to meter |
| 64 | 5,6,7,8 | Day and Date according to meter |
| 65 | | Time according to PR unit |
| 66 | | Seconds and Year |
| 67 | | Month and Date |
| 68 | | Day and Date according to PR unit |
| 69 | | Date Table Selector/Meter Constant Table Selector |
| 70 | | Last Error Received |
| 71 | | Allowed Time Difference |
| 72 | | Display Selector |
| 73 | | Current Season |

As noted above in the description of Table IV certain errors are displayed at the display 63. These errors are identified by an error code number listed and defined in Table V hereinbelow. The word "Error" is displayed by five of the bottom row of digits with two further display digits providing the error code number for identifying the associated error condition. As listed in Table V, several different errors are determined by the sequence controller 46 during communication and data transfer between the PR unit 26 and the meter 22. The sequence controller 46 produces calculations of the sums of the meter constants (checksum) and calculates the sums of the meter reading memory registers received from the meter in the old meter data. The sums calculated by the PR unit are compared with the sums which are included in the received meter data items indicated in Table III hereinabove. The time and date data in the meter 22 is compared to the time and date data of the PR unit stored at the address beginning at 0800 in the PR-RAM section 56a. The time and date data in the old and the new meter data are compared and the time and date of the old meter data is compared to determine if it is within a predetermined deviation of real time maintained in the PR unit 26. The sequence controller 46 also calculates the current season (summer or winter) identified by ID numbers 73 from the day of the year data to check if the current season indicated in the meter M-RAM is correct. The error code number 31 is a check within the PR unit 26 to determine that the meter constants and meter rate selection data in the PR-PROM 54 has been properly stored in the meter program data memory area of the PR-RAM 56a. The error codes and the associated error condition indicated thereby are listed hereinafter in the Table V:

TABLE V

ERROR CODES

| ERROR CODE NO. | ERROR CONDITION |
|---|---|
| 1 | Communication Interrupted Reading Old Data |
| 3 | Checksum Error in New Data Received |
| 4 | Communication Interrupted While Sending Key Word |
| 5 | Communication Interrupted While Sending Key Word |
| 6 | Communication Interrupted While Sending New Data |
| 7 | Communication Interrupted While Sending New Data |
| 8 | Communication Interrupted While Receiving New Data |
| 9 | Communication Interrupted While Receiving New Data |
| 10 | Communication Checksum Failed - Old Data |
| 11 | Meter Readings Do Not Add Up To Total |
| 12 | Time is not within allowed tolerance. |
| 21 | New time set in meter does not check. |
| 22 | New data received does not match data sent out. |
| 30 | Trying to reprogram meter with wrong rate table selector |
| 31 | RAM memory was not initialized from PROM. |

The operation of the PR unit 26 is described hereinafter with reference to the program flow charts shown in FIGS. 6 through 17. Binary coded instructions for defining the steps of operation of the sequence controller 46, including the microprocessor system as described hereinabove, are stored in the PR-PROM 55. The description of the flow charts is to be taken in connection with the description of the PR unit 26 hereinabove including the various tables Table I through Table V. The fixed program memory stored in PR-PROM 55 is stored at the memory address 000–7FF and at 1000–1FFF as noted hereinabove.

Figure 6:
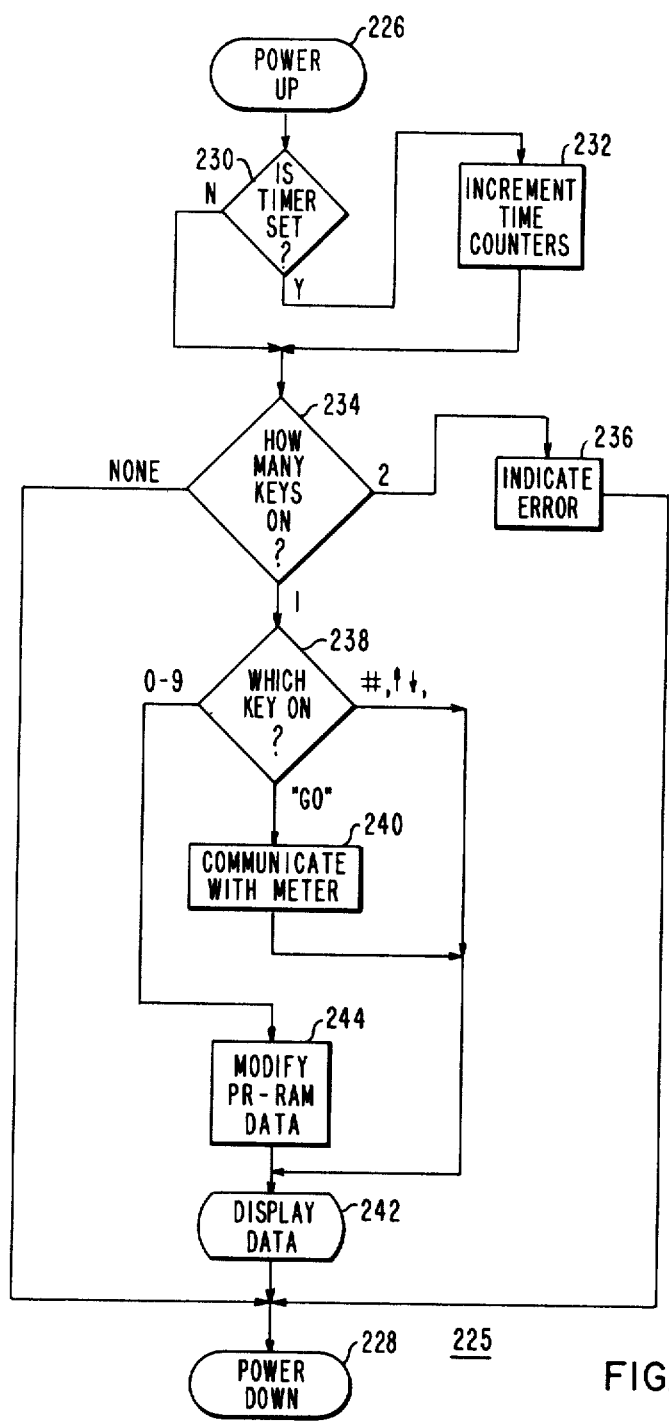
FIG. 6 is a flow chart diagram of the general program of the sequence of operations of the programmer-reader unit circuit shown in FIGS. 1, 2A and 2B.

FIG. 6 shows a general program routine 225 extending between an entry of the program at power up at 226 and a termination at power down at 228. These times include power up initialization and power down routines of the microprocessor system. It is important that the operations of the PR unit 26 are all terminated upon completion of the separate operations so as to conserve the energy of the power supply battery 62. The power supply 61 continuously energizes the critical loads from the supply line 190 to maintain the timer oscillator 116 in operation and maintain the PR-RAM's energized for non-volatile memory therein. The power-up program entry 226 is initiated by either an entry at the keyboard 66 or the timing signal 184 and the power-up initialization occurs as described in connection with the description of FIG. 5. The decision 230 has to determine if the power-up was initiated by the timing signal 184 and if yes, the time and date counters are incremented at the memory area at address 0800 through 0806 in PR-RAM at the operation 232. After the operation 232 or if the decision 230 is no, the decision 234 checks whether or not a key has been activated at the keyboard 66. If no entries have been made at the keyboard, the program proceeds from the decision 234 to the power-down program exit 228. If two keys were depressed together, an error will be generated at the operation 236 which will cause the word "Error" to appear on the display 63 and the program will progress to power-down 228. If one key has been depressed the decision 238 examines which of the keys have been depressed. It is noted that the clear key CL is depressed to initialize the operations of the PR unit. Subsequent commands or data entry are initiated by the GO key or the # control key 96.

If the GO keys 102 or 102a are pressed the data communication cycle of operation is initiated with the meter as indicated by the operation 240 and then the program proceeds to the display data operation 242. If the control key 96 is depressed and then two of the display ID number digits are entered or if the advanced key 72–72a or decrement key 74 or 74a are depressed the display operation 242 is also performed. If the control key 96 is depressed and a ID number has been entered and then this is followed by further entries at the number keys of the keyboard 66 the decision 236 goes to the operation 244 where the entered data modifies the contents of the PR RAM storing the meter program data at the data item associated with the display ID number. The operation 244 is then followed by the display data operation 242. As noted hereinabove, the three meter data memory areas of the PR-RAM 56a may be selected for display at the operation 242 in connection with the description of the display ID number 72 included in Table IV.

Figure 7:
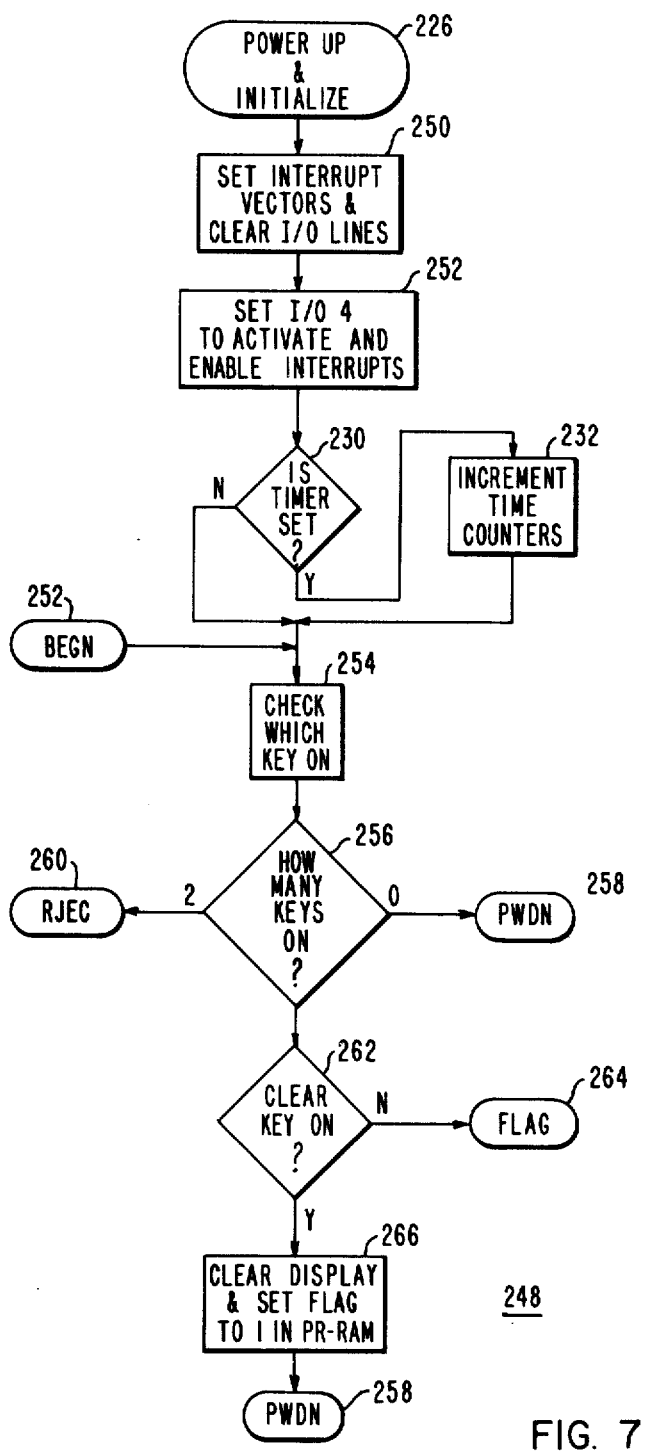
FIG. 7 is a flow chart diagram corresponding to FIG. 6 showing the general sequence of instructions provided by the program memory of the programmer-reader unit.

The general program flow chart 248 shown in FIG. 7 shows the sequence of operations as shown in FIG. 6 and additionally indicates the points where the more detailed routines, which are shown in the subsequent FIGS. 8 through 18, enter at the designated labels. The power-up 226 start of the general program routine as is as described before. The CPU 110 begins the initialization in accordance with the established operations thereof including the operation 250 in which the interrupt vectors are set and input and output lines are cleared. At operation 252 the CPU initialization is completed and the logic at the I/O 4 signals the power-on logic 76 that the initialization has been completed. The CPU 110 enables the interrupt inputs so that the program sequence of operation can be put into a interrupt mode of operation in accordance with the operation of the CPU 110. The decision 230 and operation 232 are as previously described for incrementing the time and date data in response to a timing signal 184. A program routine label BEGN is indicated at 252 which enters the general routine 248 during operations where the PR unit 26 is continuously powered when the battery 26 is connected to a charger unit. The operation 254 examines the inputs from the keyboard 66 as also noted hereinabove and the decision 256 proceeds to a power-down PWDN label 258 if no keys have been depressed. A reject RJEC label 260 is executed if two keys are improperly depressed. If only one key has been depressed the decision 262 determines if it is the clear CL key 100. If the clear key is not the key depressed the general flag routine at label 264 is entered as shown on FIG. 8. If the clear key has been depressed, the operations at 266 are provided to clear the display and set the flag registers in the PR-RAM to one. The clear key is normally the first key depressed when starting up operation before performing further operations of the PR unit 26. Following the operations 266, the power-down routine label 258 is reached for turning off the non-critical loads in the sequence described hereinabove with a description of FIG. 5.

Figure 8:
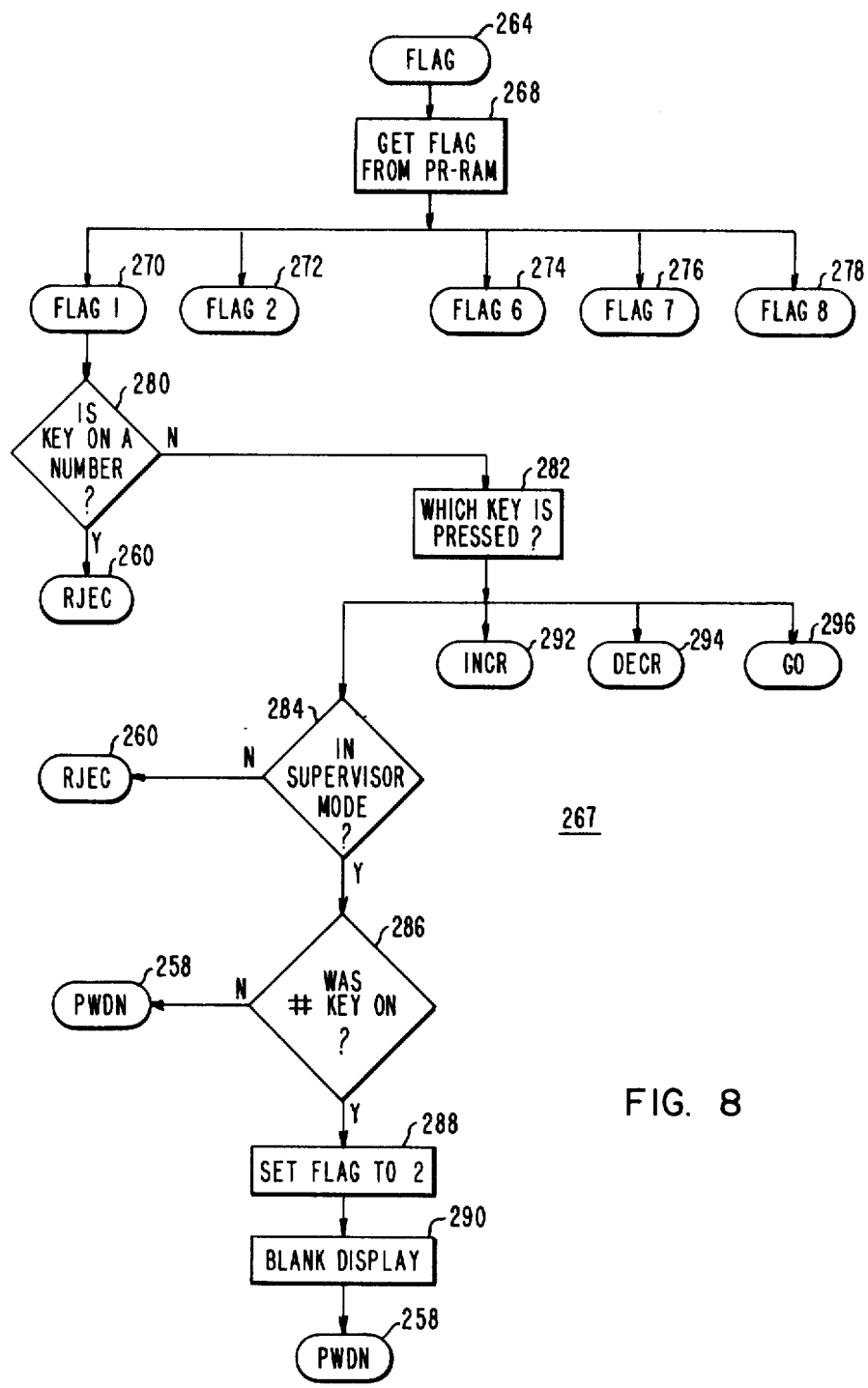
FIGS. 8 through 18 are flow chart diagrams of the program routines for providing the different sequences of instructions generally shown in the flow chart diagram of FIG. 7.

The flag routine 267 begins at the label 264 and the first operation 268 is to see the current flag that is set in the PR-RAM memory area 0807 to 0839 addresses. The flags 1, 2, 6, 7, and 8 may be set and the FLG routine is followed as indicated in FIG. 8. The FLG 1, 2, 6, 7, and 8 routines are indicated by labels 270, 272, 274, 276, and 278, respectively. The label 270 is followed if the flag 1 is set and the decision 280 determines whether or not a number key of the keyboard 66 has been depressed. If yes, the RJEC label 260 is reached and if no, the operation 282 determines which of the keys are depressed and the operation proceeds accordingly.

If the # control key 96 has been depressed, the decision 284 determines whether or not the PR unit is in the supervisor mode. This controls the operation so that data entries and detail examination of the stored data items can be made only in the supervisor mode as is established by the mode switch 70. Accordingly, if the supervisor mode is not active the RJEC routine label 260 is reached. When the decision at 284 is yes, then the decision 286 determines whether or not it was the # control key 96. If the control key was depressed, then the operation 288 sets the flag register to 2, the display is blanked in the operation 290, and the power-down routine 258 is reached which also occurs if decision 286 is no. In the operation 282, the depressing of the increment keys 72-72a or decrement keys 74-74a will cause the routine to go to the associated INCR label 292 or DECR label 294. If the GO keys 102-102a are depressed, the GO label 296 is executed as shown in the FIGS. 17, 18 and 13, respectively.

Figure 9:
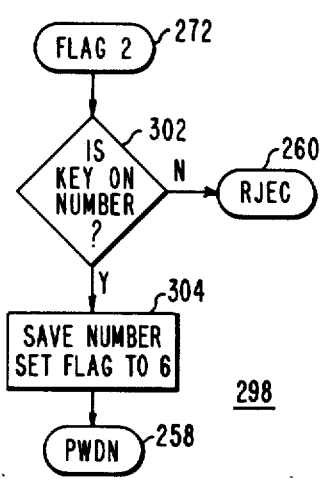
Figure 10:
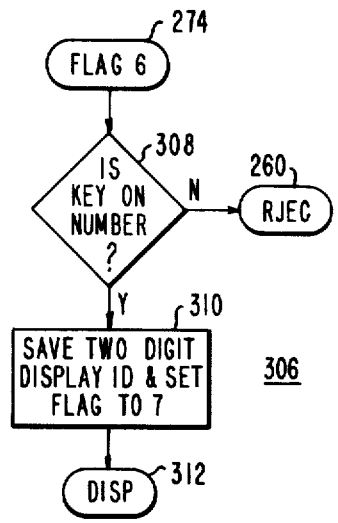
Figure 15:
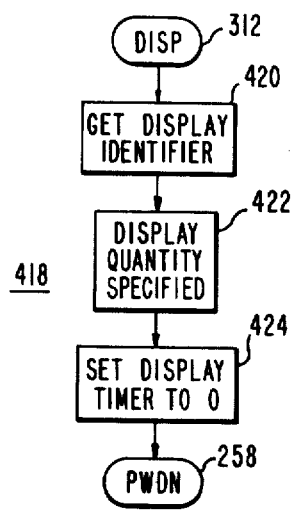

The routine 298 starting at FLG 2 label 272 is shown in FIG. 9. The decision 302 determines whether a number key at the keyboard has been depressed and if not it goes to the RJEC routine label 260. If the decision at 302 is yes, the operation 304 saves the number entered and sets the control flag to 6 and then goes to the power-down label 258. The flag routine 267 checks to find that the flag 6 has been set and the routine indicated at label 274 shown in FIG. 10 is entered. Beginning at the start of the FLG 6 routine 306 at label 274, the decision 308 is to test if the next key is a number and if yes, then two numbers will have been entered and the operation 310 establishes that the numbers defined a two digit display ID number and the flag register is set to 7. Thus, in the supervisor mode of operation the control key 96 is pressed and then followed by two numerical digits to define a display ID number which causes a display routine as indicated by the display label 312 at the end of the routine 306 in FIG. 10. The display label 312 is shown in FIG. 15 and is described further hereinbelow.

Figure 11:
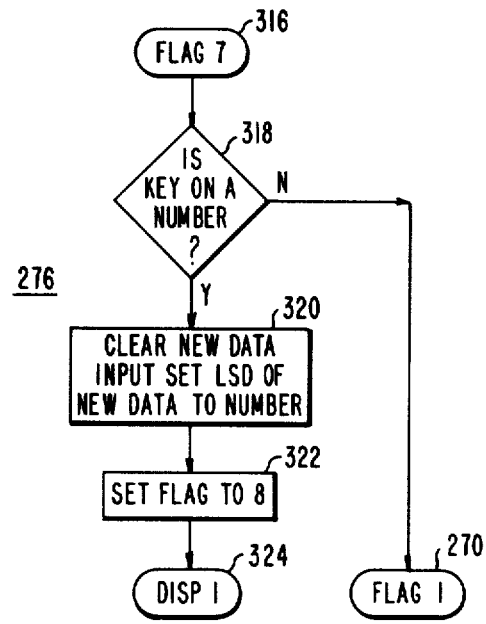

The FLG 7 routine 276 is shown in FIG. 11 starting at label 316. The decision 318 determines whether a further number key has been depressed. If a key has not been depressed then the subroutine returns to the FLG 1 label 270. If the decision is yes, the operation 320 clears a new data input for temporarily storing the data entered at the keyboard 66 in the scratch pad memory beginning at the address 0807 of the PR-RAM 56a. The new data from the keyboard is stored in the least significant digit portion of the memory, corresponding to a number entered on the keyboard. The operation 322 follows 320 to set the control flag memory to flag 8. Thereafter, the DISP 1 label 324 is entered.

Figure 12:
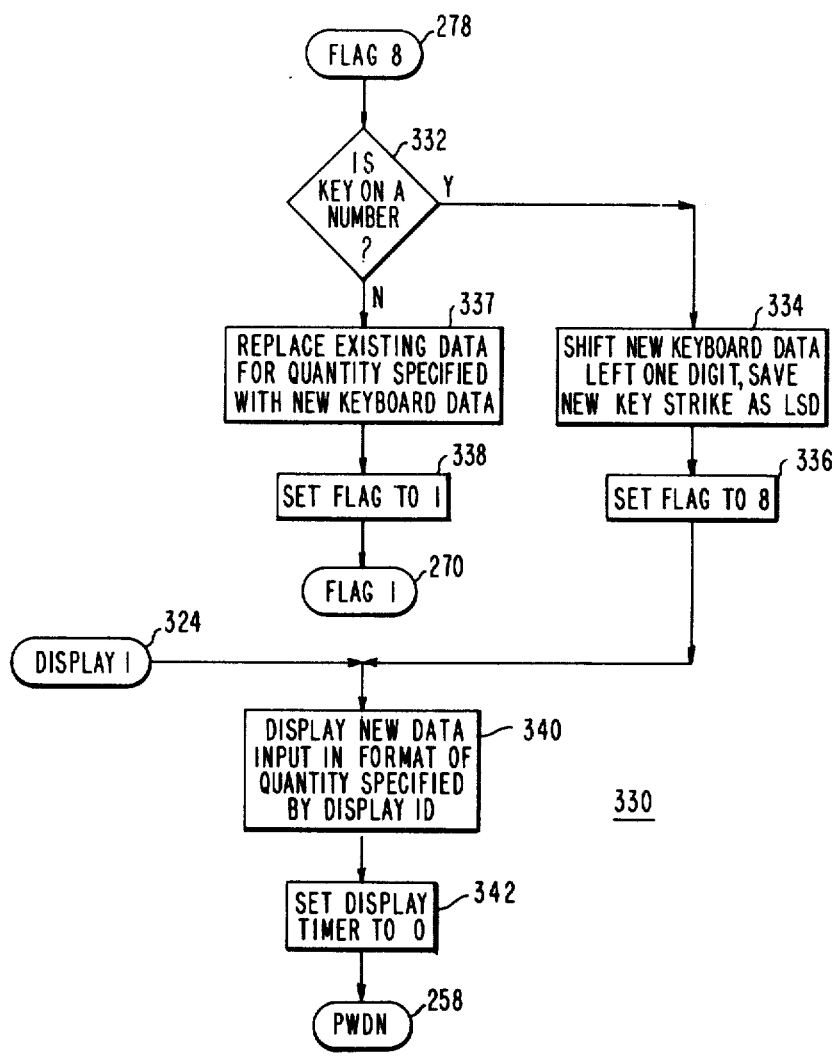

The FLG 8 routine 330 is shown in FIG. 12 beginning at label 278. The decision 332 examines if a further number key has been depressed at the keyboard 66. If the decision 332 is yes, the operation 334 shifts the new data input from the keyboard left one digit in the applicable register in the scratch memory noted hereinabove and saves the number entered by the last key entry as the least significant digit therein. The operation 336 follows to set the flag to 8 waiting for an additional number key entry for additional data to complete the particular data item storage which is being changed. When the decision 332 finds no further number key has been activated, the operation 337 replaces the existing data in the meter program data memory area beginning at the address 0A00 with the new data input from the keyboard which is temporarily stored in the aforementioned scratch pad memory. The operation 338 follows to set the flag to 1 and operation proceeds to the FLG 1 label 270.

In the routine 330 shown in FIG. 12, the operation 336 is followed to the point of the DISP 1 label 324 noted hereinabove with the description of FIG. 11. The operation 340 follows so that each digit entered at the keys of the keyboard 66 will be displayed as new keyboard data at the display 63 with the associated display ID number. The data item being changed will be identified. The operation 342 sets a display timer to zero to affect a six second display timer turn-on cycle at the display 63 following the entry of the data at the keyboard. The power-down PWDN label 258 is reached while the display is timing out. It is to be noted that the display 63 is supplied from the critical load supply line 190 by the power supply 61 during the timed period of operation not to exceed six seconds. Accordingly, the power-down routine begins after the beginning of the display period to turn off all of the non-critical loads except the display to further conserve the battery 62. A display timer register in the PR-RAM 56a is set to six seconds at the beginning of a display period and then each time updating sequence of operation, initiated by the timing signals 184 and occurring at one second intervals, causes decrement of the display timer so that when it reaches the end of a six second period the display is deenergized.

Figure 13:
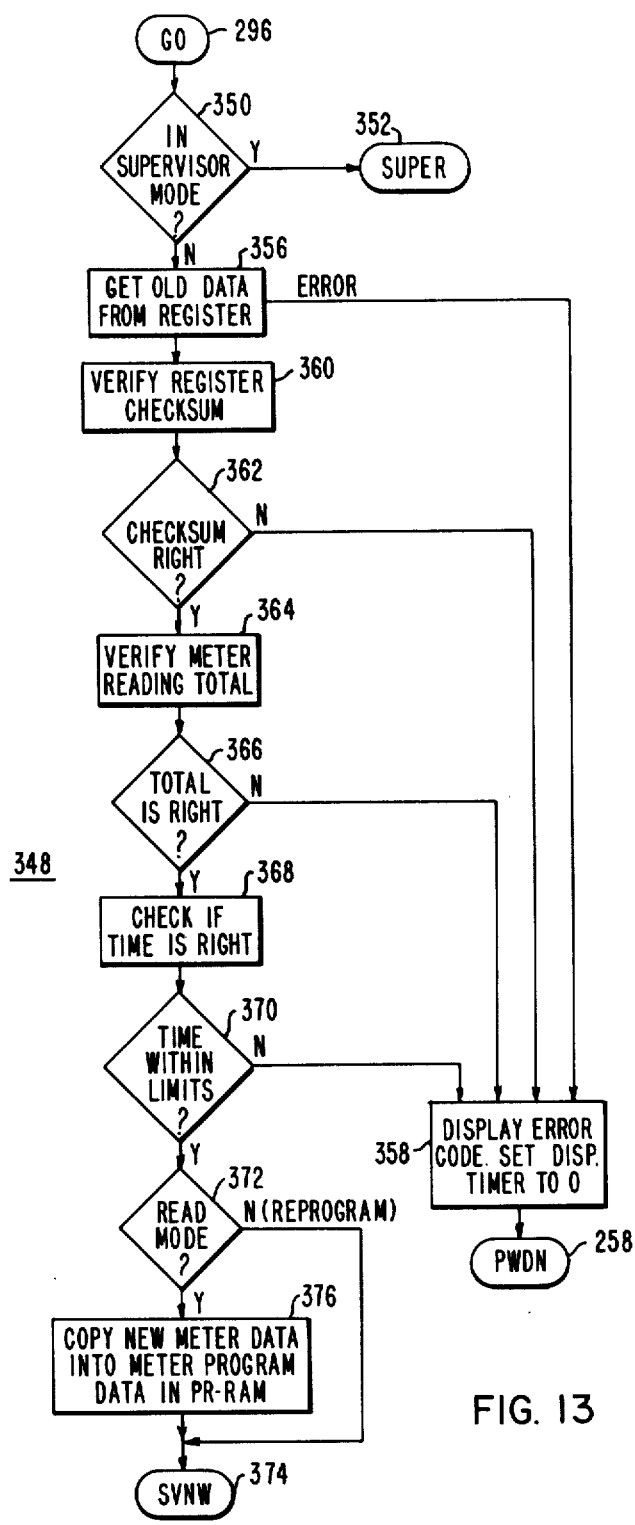

In the routine 267 shown in FIG. 8 the operation 282 determines which of the input keys have been depressed and if the GO keys 102 or 102a have been depressed, the routine 348 is entered as shown in FIG. 13. The beginning of a routine at label 296 proceeds to the decision 350 to determine whether or not the operation is in the supervisor mode. If the decision is yes, the SUPER label 352 is for indicating that a check is made to determine that the data items stored in the replaceable PR-PROM 54 have been stored in the PR-RAM memory area and then the program routine 348 would proceed to the save new meter data SVNW routine 354, shown in FIG. 14 and described hereinbelow. When the decision 350 is no, the operation 356 gets the meter data from the M-RAM 34 of the meter 22. Thus, when the meter is operating in the read mode the communication with the meter is established by pressing either of the GO keys 102 or 102a. If an error occurs in the communication, as defined by the error code Table V hereinabove, the operation 358 will set the display for displaying the word "Error" with the associated error code number and the display will be operative for the six second display time. The PWDN label 258 will then be reached. The old meter data is stored at operation 356 in the PR-RAM 56a address 0900 through 097F. The operation 360 calculates the checksum and the decision 362 compares to see if the checksum calculated in the PR unit 26 matches checksum data item in the old meter data. If the decision 362 is no, then an error display operation 358 occurs. If the decision 362 is yes, the operation 364 then calculates in the PR unit to check if the total of the meter readings match the total of the meter readings as included in the received meter data. This last comparison occurs at the decision 366. If the meter total is incorrect then the decision 366 is no, and another error display operation 358 occurs. If the decision 366 is yes, the operation 368 compares the time and date data of the meter with the time and date stored in the PR unit 26 and the decision 370 makes the comparison between the meter data and the corresponding reference time and date of the PR unit. If the decision 370 is no, then the error display operation 358 occurs. Predetermined time difference limits are established by keyboard data entries associated with display ID number 71. The program continues to the decision 372 and if the switch 70 inputs indicates that the PR unit 26 is in the reprogram mode the program routine shown in FIG. 13 goes to the SVNW label 374. When the decision 372 is yes, the operation 376 causes the PR unit 26 to copy the received meter data stored at the address 0900 through 097F into the meter program data at address 0A00 through 0A7F for transmitting the old meter data back to the meter 22 to preserve the meter readings thereof. The kilowatt demand counters including data items 19, 20 and 21 are set to zero and the old security code data item 38 is observed to establish that there has been no unauthorized communication with the meter.

Figure 14:
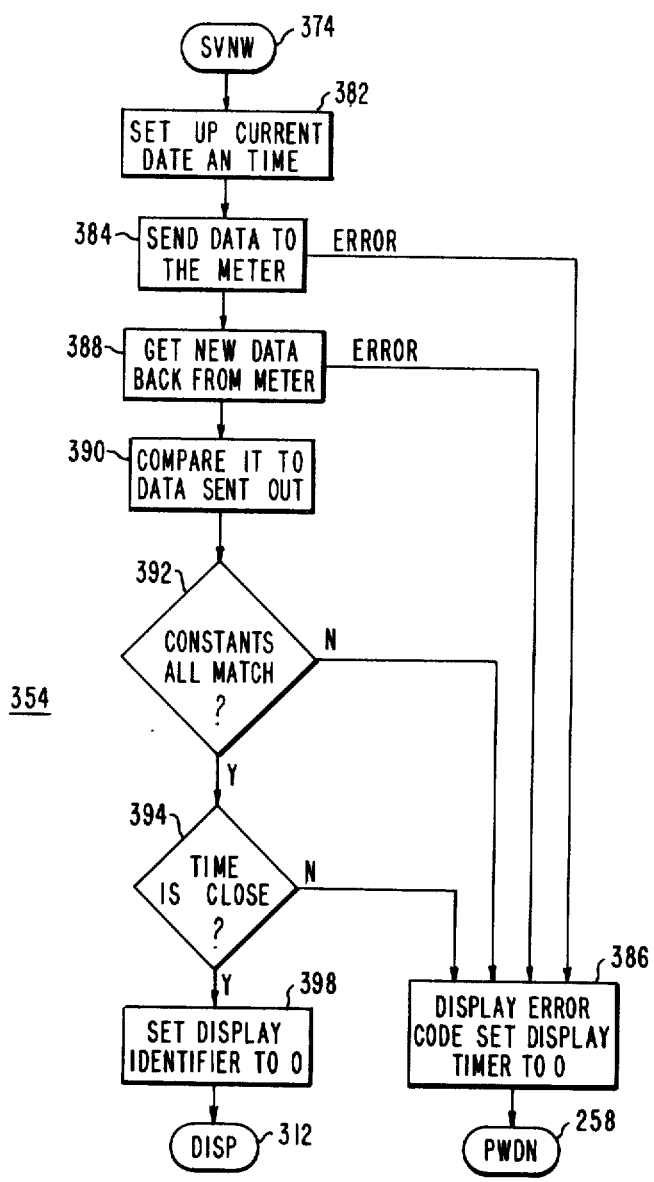

The SVNW subroutine 354 is shown in FIG. 14 and commences at label 374. The operation 382 sets up the current date and time data of the PR unit for sending the correct time and date to the meter during each communication with the meter. The operation 384 sends the PR unit time and date data into the data to be sent the meter memory area included at the address 0A00 through 0A7F. If an error occurs in the communication with the meter, the display error operation 386 is performed as described for the operation 358 in FIG. 13. The new data sent to the meter is then transmitted back to the PR unit and stored at the new meter data memory area at the address 0980 through 09FF. Each time new meter program data is entered in the M-RAM 34 the OCODE data item 38 is replaced by the existing NCODE data item 37 and a new NCODE data item 37 is generated by the metering sequence controller 24. If a communication error occurs during the operation 388, the display error operation 386 is performed. The operation 390 then compares the data received in the new meter data and checks that the meter constants are correct and the decision 394 checks that the time and date data included in the new meter data is within the limits and if either of the decisions 392 or 394 are no, then the error display operation 386 is performed. If the decision 394 is yes, the operation 398 sets the sequence of operation of the routine 354 to the display ID number 0 and the program ends at the display DISP label 312. The power-down label PWDN 258 follows the operation 386 as described for operation 358 above.

It is to be noted that the SVNW routine 354 is entered when the PR unit is in the supervisor mode in which case the meter constants and rate schedule constants are placed into the meter program data memory area at step 384. Thus, the operation 384 sends data to the meter which is either a modified form of the old meter data, as in the read mode, all new meter data as is in the supervisor mode used for initializing the meter in which case the meter measuring memory areas of M-RAM are set to zero, or as in the reprogram mode selected data is entered from the PR-PROM 54 tables and then stored in the meter program data memory area for transmission to the meter 22.

Referring now further to some of the details of the routines noted hereinabove, the FIG. 15 illustrates the display routine 418 beginning at 312. The operation 420 is to establish the current display ID number and the operation 422 then displays the data item associated with the ID number as explained hereinabove. The display is then made at the digits of the display 63 commencing with setting the display timer to zero. The display continues for the six seconds time period while the program goes to the power-down PWDN label 258 noted hereinabove.

Figure 16:
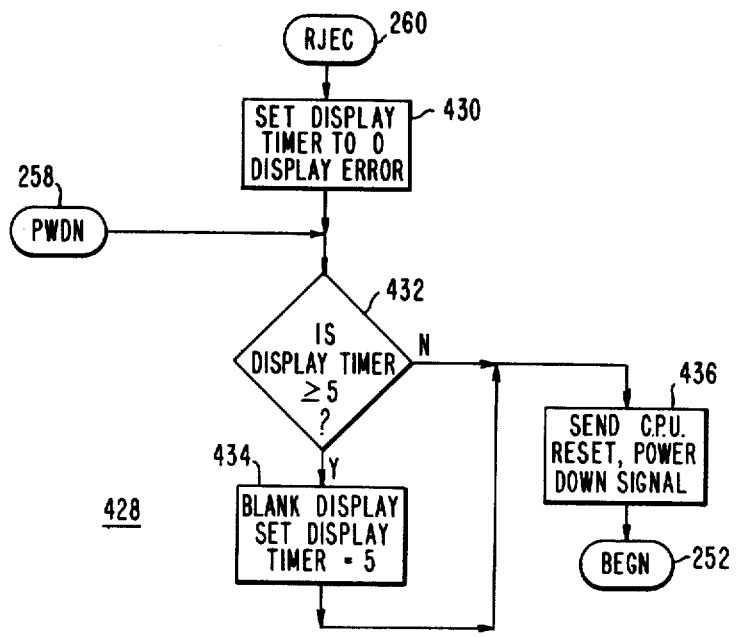

The reject RJEC routine 428 begins at label 260 in FIG. 16 and the operation 430 displays the error condition initiating the reject routine. For example, this routine is initiated as shown at decision 256 at FIG. 7 by depressing two of the keyboard keys together causing "Error" to be displayed at the operation 430 where the display timer is set to zero. The power-down label 258 enters the routine 428 shown in FIG. 16 where the decision 432 checks the display timer memory to determine if it is equal to or less than five seconds of remaining display time. If the decision is yes, at decision 432, the operation 434 sets the display timer to equal five seconds and blanks the display and then proceeds to the operation 436 as does the no result at the decision 432. The operation 436 sends a CPU reset signal which starts the power-down cycle of operation of the CPU 110 which initiates the logic at the I/O 5 logic line and the circuit goes into the power-down routine. The routine 428 then goes to the label BEGN 252 noted hereinabove in FIG. 7.

Figure 17:
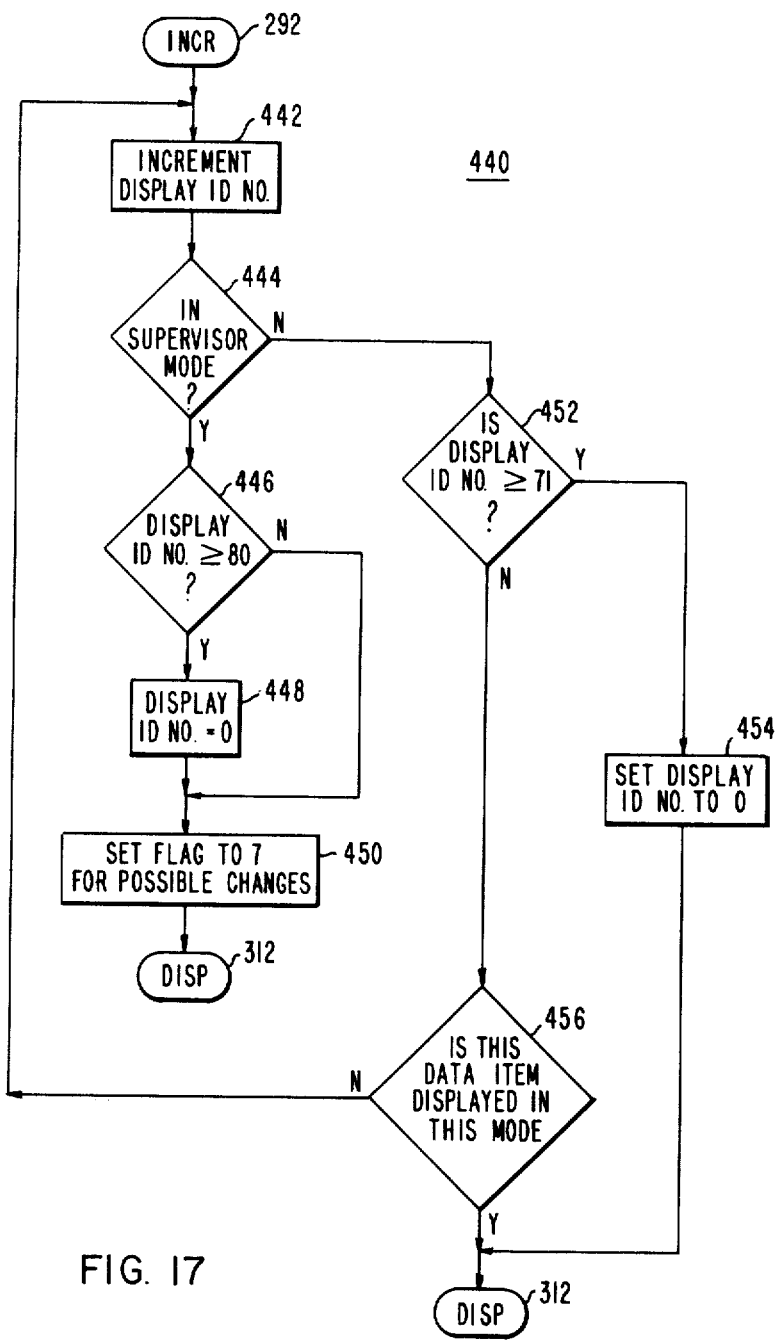

In the flag routine 267 described hereinabove in connection with the FIG. 8 the operation 282 tests which of the keys have been depressed and the FIGS. 17 and 18 describe the display increment INCR routine 440 and display decrement DECR routine 441, starting at labels 292 and 294, respectively. These routines allow the display to be advanced one number of the display ID number or rolled back to the previous display ID number by simply pressing either one of the advance or decrement keys. In FIG. 17, after the INCR label 292 the first operation 442 is to advance the ID number from the present number to the next highest number. The decision 444 determines whether or not the operation is in the supervisor mode and if yes, the decision 446 determines whether or not the present display is at the end of the display such as indicated by an ID number 80. If the decision 446 is yes, then the operation 448 sets the display sequence of operation to the beginning display ID number zero. If the decision 446 is no, operation 450 sets the flag 7 to enable data entry changes through the keyboard 66 as described hereinabove. The display routine label 312 follows for displaying the data item corresponding to the selected display ID number.

When the decision 444 is no, the decision 452 tests if the display ID number is equal to or greater than 71 and if yes, the operation 454 sets the sequence of display operation to the ID number zero. If the decision at 452 is no, the decision 456 determines whether this quantity indicated by the ID number is to be displayed in this mode and if yes, the routine goes to the display DISP label 312 as it does from the operation 454. The decision 456 is used only in the read and reprogram modes where only some of the quantities are displayed. The decision 452 determines if the present ID number is above the highest ID number displayed in the read mode.

Figure 18:
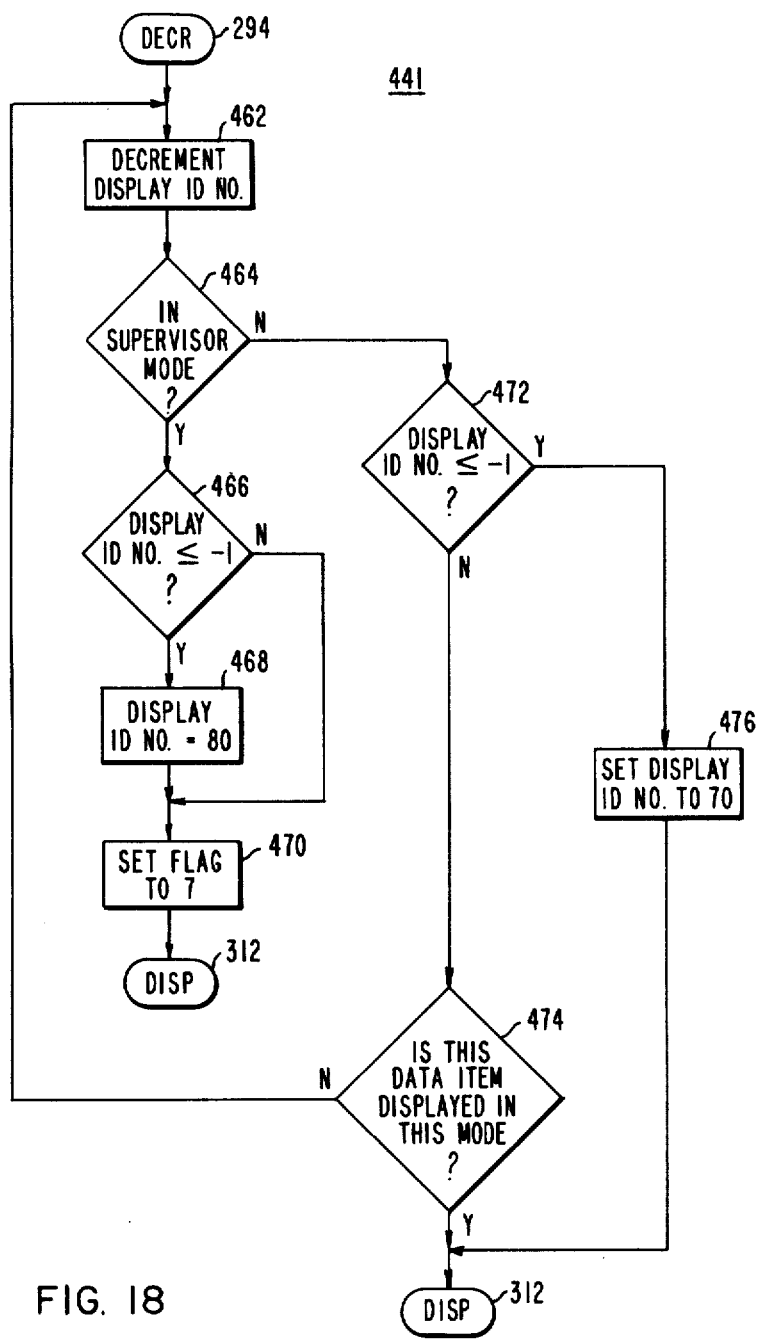

Decrement routine 441 beginning at label 294 is shown in FIG. 18. It has a sequence of operation substantially reversely corresponding to the routine 440 shown in FIG. 17 so that the previous ID number is reached from the present display ID number by each actuation of the keys 74 or 74a. Accordingly, operation 462 rolls back the ID number to the previous ID number. The decision 464 tests whether or not the supervisor mode is active and if yes, the decision 466 tests whether or not the display ID number is equal to or less than minus one indicating that the decrement key has rolled back the ID number beyond the zero number. If decision 466 is yes, the operation 468 moves the sequence of operation of the display to the highest number 80 and the following operation 470 sets the flag 7 to enable data entry through the keyboard. Similarly, if the decision of 466 is no, the operation 470 is reached and thereafter the label DISP 312 is reached. When the decision 464 is no, the decision 472 tests whether or not the display ID number is equal to or less than minus one and if no, the decision 474 tests whether or not this quantity is displayed in the existing mode of operation of the PR unit. If no, the routine 441 goes back to the operation 462. If the decision 474 is yes, then the display label DISP 312 is reached. If the decision of 472 is yes, the operation 476 sets the display sequence of operation to the ID number 70 which is at the end of the data items which are displayed in the read mode and the display label 312 follows.

In accordance with the description of the present invention hereinabove, the following are typical operations that are performed when initially programming the meter 22 or reading the data of a meter 22 after it has been installed and operating at a metering site. The PR unit 26 would normally be used in a shop area and would have to be initialized before initializing and setting up the meter 22. For such PR unit initialization the key operated mode switch 70 would be set to the supervisor position. Next, the clear key CL would be pressed and the first data to be entered into the PR unit would be the time of day. Accordingly, the # control key 96 would be depressed and thereafter the two digits 6 and 5 would be entered on the numerical keys of the keyboard to set the display sequence of operation at the display ID number 65. The am and pm flag would be set for zero if the present time was in the morning or one if the present time was in the afternoon. Then the real clock time would be entered by two digits representing hours followed by two digits representing units and tens digits of minutes. For example, if it were desired to set 1:58 pm following entry of the ID number 65 the keys 1 for pm and 01 for hours, and then 58 would be pressed on the keyboard 66. The display digits would display the numbers 65 for the ID number and the numbers 01 and 58 representing the 1:58 pm clock time.

Next, the PR unit 26 would be initialized by entering the display ID number 66 and thereafter two digits for seconds would be entered and then two digits for the year. For example, the numbers 39 and 79 could be entered for indicating 39 seconds after 1:58 pm for the year 1979. The program provides for the initialization of the PR unit seconds and year. When the advance key is pressed, the advance key, as noted hereinabove, automatically enters the data received from the keyboard into the memory areas of the PR-RAM memory. The ID number will now be set to 67 by the previous operation of the advance key and thereafter two digits are entered for the month followed by two digits indicating the day of the month. Therefore, the digits 02 and 21 would be entered for Feb. 21, 1979. The advance key is again depressed to store the keyboard data and to advance to the next ID number. The ID number 68 corresponds to the day and date so that one digit one through seven would be entered for indicating the day of the week. The advance key would then be depressed so that the data would be entered into the PR unit memory and the next ID number 69 would be displayed at the display 63. The meter constant identification and the rate schedule identification would be entered by the digits one through nine for each of the two quantities to be selected from the one of ten of each quantity stored in the tables of PR-PROM 54. If a rate schedule identification of zero is selected and a meter constant identification of one is selected, a one and zero will be displayed on the display 63 along with the ID number 69. The advance key is again depressed and this will load the selected rate schedule and meter constants into the corresponding area of the meter program data memory area of PR-RAM from the PR-PROM 54. The required data entries for initializing the PR unit 26 will be provided by the above sequence of operation.

If additional data is desired to be entered, for example for programming an identification into the meter, the control key 96 will be depressed and then the display ID number 00 will be entered at the keyboard and then nine number digits will be entered from the keyboard for the predetermined meter identification. The advance key 72 is depressed then to enter the meter identification into the corresponding data item register of the meter program data memory area of the PR-RAM. Any other appropriate data which is desired to be programmed into the meter, such as the transformer ratio having a display ID number 01 may be entered as described above.

For initializing the meter 22, the meter is set up for operation and the PR unit 26 is operated in the supervisor mode. The interfaces 48 of the PR unit 26 are aligned with the interface 42 of the meter 22 and the GO key either at 102 or 102a is depressed and the meter communication sequence of operation will occur. The contents of the meter program control data of the PR-RAM will be transferred into the M-RAM registers so that the corresponding data items are transferred to corresponding registers and RAM memory areas as described hereinabove.

The PR unit 26 is also usable in the field for purposes of reading the meter reading data at each meter in the read mode of operation as established by the key operated switch 70. The meter data in M-RAM 34 is transferred into the old meter data memory area of the PR-RAM 56a and new time correcting data is transferred back to the meter along with the originally received meter data except that the demand measuring data items are zeroed.

For the reprogramming mode of operation, new rate schedule, or new meter constants may be desired to be entered in the field and these items would be changed by replacing the PR-PROM 54 with another PROM chip having different rate schedule and meter constant information programmed with the same identifying number so that this information would be sent into the meter 22 and operation similar to the read mode would also be performed at the same time the PR unit is operated at the meter field site to reprogram it. Other changes may be made in the various data items while the meter is operated in the supervisor mode and then it could be switched to the reprogram mode when it is taken into the field for transferring modified data items in the meter 22.

The replaceable PR-PROM 54 permits easy checking of the meter 22 since a test rate schedule can be entered into the M-RAM 34 having the times for accumulating the measured electric energy data in the different time related billing categories closely spaced. The response of the meter 22 at the changes in rates can be observed over a few minutes to verify that the different time related metering operations are being performed.

While a preferred form of the present invention is described hereinabove, it will be apparent to those skilled in the art that other obvious changes or modifications may be made without departing from the spirit and scope of this invention.

I claim:

1. A programmer-reader unit for a programmable time registering AC electric energy meter including a transducer producing pulse signals related to an electric energy quantity to be measured, a clock producing real time data, a memory containing program control data, said program control data including constant data items representative of metering rates and variable data items representative of real time categories, a meter sequence controller comparing said real time data to said variable data items and selecting a constant data item in response to said comparison, said metering sequence controller accumulating said pulse signals in response to said selected constant data item, and an external data communications interface responsive to said sequence controller, said programmer-reader unit comprising:

first memory means including memory locations for storing meter programming input data items transmittable to said meter;

second memory means including memory locations for storing meter output data items receivable from said meter, said data items including said accumulations of said metering pulses;

timer circuit means generating regularly occurring timing signals;

means generating, independently of said meter, reference real time data in response to said timing signals and storing said reference time data at a predetermined data item memory location of said first memory means;

bidirectional communication interface means for communicating with said external data communications interface of said meter, said communications including the transfer of the data items of said program control data from said meter to said memory locations of said second memory means for meter output data items and the transfer of the meter programming input data items from said memory locations of said first memory means to said meter thereby replacing predetermined ones of said data items of said program control data utilized by said meter including the real time data items so as to program said meter with said reference time data during each transfer of data between said meter and said unit;

data comparison means for measuring time differences between the real time data items received from said meter and stored in said second memory means and said reference real time data produced by said means generating said reference real time data; and error indicating means responsive to a predetermined value of time difference measured by said data comparison means.

2. The programmer-reader unit as claimed in claim 1 including third memory means having memory locations for storing meter output data items receivable from said meter and wherein said communications include the transfer of the data items of said program control data from said meter to said memory locations of said third memory means after the meter programming input data items of said first memory means have been transferred to said meter.

3. The programmer-reader unit as claimed in claim 2 wherein said time comparison means measures data differences between the real time data received from said meter and stored in said third memory means and said reference real time data.

4. The programmer-reader unit as claimed in claim 1 including read only memory means storing constant data items having predetermined coded values for use in said program control data of said meter, and means for loading said constant data items into said memory locations storing meter programming input data items in said first memory means.

5. The programmer-reader unit as claimed in claim 4 wherein said read only memory means includes predetermined sets of said constant data items and wherein said sets have different coded values from each other, and said means for loading said constant data items loads preselected ones of said sets of constant data items into said memory locations of said first memory means.

6. The programmer-reader unit as claimed in claim 5 wherein said read only memory means includes a removable programmable read only memory chip.

7. The programmer-reader unit as claimed in claim 6 wherein said sets of constant data items includes one set of meter constants data and one set of metering rate time schedule data.

8. The programmable-reader unit as claimed in claim 4 including a sequence controller and a mode select means for selecting between supervisor and read operating modes, said supervisor operating mode enabling said sequence controller to transfer said constant data items in said read only memory means to said memory locations of said first memory means for initially programming the coded values of said constant data items into said program control data of said meter, and said read operating mode enabling said sequence controller to transfer coded values of the data items stored in said memory locations of said second memory means following transfer thereto from the meter to be transferred into said memory locations of said first memory means for returning the coded values of predetermined ones of the data items of said program control data back to said meter as received by said programmer-reader unit.

9. The programmer-reader unit as claimed in claim 2 including further data comparison means for comparing the constant data items transferred to said program control data in said meter with the constant data items transferred back from the program control data to the programmer reader unit, and error indicating means responsive to a difference between the constant data items transferred to and received back from the program control data of said meter.

10. The programmer-reader as claimed in claim 2 wherein the constant data items are expressed as coded values, and wherein the sum of the coded values of predetermined ones of said constant data items of said program control data are included in a check sum variable data item of said program control data, said programmer reader-unit further including means for summing the coded values of said predetermined ones of said constant data items to produce a corresponding check sum data item in said programmer reader unit, and further including still further data comparison means for comparing the check sum data item produced in said programmer reader unit and the check sum data item included in the program control data received from said meter, and still further including further error indicating means responsive to a difference determined by said data comparison means for verifying the check sum data item received from said meter.

11. The programmer-reader unit as claimed in claim 10 including power-off means responsive to each of the error indicating means to power down said programmer-reader unit by deenergizing non-critical electrical loads of said programmer reader unit in response to an error condition.

12. The programmer-reader unit as claimed in claim 1 wherein further predetermined ones of said variable data items of said program control data include separate coded values representing measured electric energy data corresponding to peak, mid-peak and base rate time related measuring categories receivable in said second memory means and further including visual display means for indicating the numerical values of said coded values of said measured electric energy data items received from said meter.

13. A programmer-reader unit as claimed in claim 12 including manual display control means for effecting display of different predetermined ones of said data items of said program control data received from said meter.

14. The programmer-reader unit as claimed in claim 10 including a mass data read-write memory means for storing the measured electric energy data items of the program control data transferred to said programmer reader unit from a plurality of meters.

15. The programmer-reader unit as claimed in claim 14 including a data transfer means for producing serial data output transmissions of said program control data stored in said mass data memory means to a remote unit.

16. A portable programmer-reader unit for transferring and monitoring replaceable meter program control data utilized by a programmable time registering AC electric energy meter type including a transducer producing pulse signals related to an electric energy quantity to be measured, a clock producing real time data, a memory containing program control data having predetermined coded formats, said program control data including constant data items representative of metering rates and variable data items representative of real time categories, a meter sequence controller comparing said real time data to said variable data items and selecting a constant data item in response to said comparison, said metering sequence controller accumulating said pulse signals in response to said selected constant data item, and an external data communications interface responsive to said sequence controller, said portable programmer-reader unit comprising:

first, second and third memory means each having memory locatons for storing identical kinds of data items;

means generating reference time and calendar date data in a format corresponding to the format of corresponding time and calendar date data items of said meter program control data;

means for transferring said reference time and date data to the memory locations of said first memory means for storing reference time and date data items;

means for effecting bidirectional data communications with said external data communications interface of said meter, said communications including a first data transfer of the coded contents of the data items of said program control data in said meter including a current time data item, and old security code data item and a new security code data item to the corresponding data item memory locations of said second memory means, a second data transfer to said meter so as to replace a coded current time data item of said program control data in said meter with the coded contents of the reference time data item memory location of said first memory means while leaving the new and old security code data items of said program control data unchanged, and a third data transfer of the reprogrammed time data item and a changed old security code data item and a changed new security code data item of said program control data to said third memory means, wherein said changed old security code data item is said new security code data item;

means for displaying said changed old security code data item for comparison with a prior new security code data item, said comparison revealing unauthorized programming, said means displaying said changed new security code data item for future comparisons;

means for comparing the received coded time data items in both of said second and said third memory means with the reference time data item produced by said means generating said reference real time data; and error indicating means responsive to the comparing means when said received data item is different by more than a predetermined time value from the reference time data item.

17. A programmer-reader unit for a programmable time registering AC electric energy meter including a transducer producing pulse signals related to an electric energy quantity to be measured, a clock producing real time data, a memory containing program control data having predetermined coded formats, said program control data including constant data items representative of metering rates and variable data items representative of real time categories, a meter sequence controller comparing said real time data to said variable data items and selecting a constant data item in response to said comparison, said metering sequence controller accumulating said pulse signals in response to said selected constant data item, and an external data communications interface responsive to said sequence controller, said programmer-reader unit comprising:

sequence controller means including logic circuit means and input and outputs for receiving and transmitting binary logic signals;

timer circuit means for generating regularly occurring timing signals to said sequence controller means;

read-write addressable memory means connected with said sequence controller and including first and second memory areas having mutually identical memory locations wherein said first memory area stores meter programming input data transferrable to said meter and said second memory area stores memory output data receivable from said meter, each of said mutually identical memory locations of both of said memory areas storing identical kinds of data items, each kind corresponding to a separate data item included in said program control data utilized by said meter, and each of said identical memory locations of both of the memory areas storing said data items thereof in identical orders of sequentially arranged memory locations each being in the same order as the order of said data items of said program control data when utilized by said meter, whereby said first and second memory areas form data images of said program control data of said meter;

said read-write addressable memory means further including a further memory area storing reference real time and date data in response to said timing signals applied to said sequence controller means;

means identifying predetermined ones of said data items of said program control data having corresponding memory locations in both of said first and second memory areas by separate numerical display identification numbers arranged in numerically sequential order;

display means including a plurality of visual readout elements responsive to said sequence controller means for producing, for a predetermined maximum time period, numerical readouts of both said display identification number and the numerical value of a data item designated by said identification number;

manually operable display sequence control means for incrementally changing the sequence of producing visual readouts of said data items designated by a corresponding identification number in accordance with the numerical sequence of said identification numbers;

bidirectional communication interface means for communicating with said external data communications interface of said meter, said communications including the transfer of the coded values of the data items of said program control data from said meter to said second memory area of said read-write memory means and the transfer of the coded values from said memory locations of said first memory area to said program control data utilized by said meter;

power supply means including a critical load supply line connected with said timer circuit and said read-write memory means and a non-critical load supply line connected to higher power consuming circuits of said programmer reader unit including said sequence controller means, and further including a battery for continuously energizing said critical load supply line and selectively energizing said non-critical load supply line; and power on logic circuit means for initiating logic signals to said power supply means to effect selective energization of said non-critical load supply line in response to either said timing signals or actuation of said display sequence control means.

18. The programmer-reader unit as claimed in claim 17 wherein said display means is supplied by said critical supply line and including display timer means responsive to said timing signals to deenergize said display means after a predetermined count of said timing signals corresponding to a predetermined display time interval.

19. The programmer-reader as claimed in claim 17 including a manual data entry means formed by a keyboard having numerical and control keys wherein entry of one of said display identification numbers effects concurrent visual readout of the entered number and the numerical value of a data item designated by the identification number and further wherein additional entry of numbers at said keyboard modifies the coded value of the data items identified by the displayed identification number.

20. The programmer-reader unit of claim 17 wherein said power on logic circuit means is further responsive to actuation of any of said keys of said keyboard.

21. The programmer-reader unit of claim 17 wherein said sequence controller means includes a microprocessor system having an external interrupt input and first and second input-output logic lines and further wherein said power on logic circuit means includes means responsive to one of said timing signals, to said actuation of one of said keys of said keyboard, and to said display sequence means to initiate a power on logic signal to activate said non-critical supply line of said power supply means, means for producing a memory disable logic signal that is delayed in reaching a memory enable logic state until said first logic line assumes a logic state representing that the microprocessor system has completed power up initialization and means responsive to a change in the logic state of said second logic line for initiating a power down operation so as to return said memory disable logic signal to the disable logic state when said microprocessor system is signalled to begin a power down routine.

22. The programmer-reader as claimed in claim 17 wherein said bidirectional communication interface means includes an optical probe means connected to said sequence controller means for optically communicating with said meter for transferring the values of said data items therebetween with said probe including a control switch means for initiating data communication with said meter.

* * * * *